(12) United States Patent
Doubchak et al.

(10) Patent No.: US 11,750,221 B1
(45) Date of Patent: Sep. 5, 2023

(54) ENCODING AND DECODING OF DATA USING GENERALIZED LDPC CODES

(71) Applicant: SAMSUNG ELECTRONICS CO., LTD., Suwon-si (KR)

(72) Inventors: Ariel Doubchak, Herzliya (IL); Avner Dor, Kfar Saba (IL); Yaron Shany, Kfar Saba (IL); Tal Philosof, Givatayim (IL); Yoav Shereshevski, Tel-Aviv (IL); Amit Berman, Binyamina (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/706,179

(22) Filed: Mar. 28, 2022

(51) Int. Cl.
| | |
|---|---|
| G06F 11/00 | (2006.01) |
| G06F 11/30 | (2006.01) |
| G08C 25/00 | (2006.01) |
| H03M 13/00 | (2006.01) |
| H04L 1/00 | (2006.01) |
| H03M 13/11 | (2006.01) |

(52) U.S. Cl.
CPC .... H03M 13/1174 (2013.01); H03M 13/1108 (2013.01); H03M 13/616 (2013.01)

(58) Field of Classification Search
CPC .......... H03M 13/1174; H03M 13/616; H03M 13/1108
See application file for complete search history.

(56) References Cited

U.S. PATENT DOCUMENTS

| | | | | |
|---|---|---|---|---|
| 2005/0243911 A1* | 11/2005 | Kwon | ............... | H04N 19/137 375/240.18 |
| 2005/0243912 A1* | 11/2005 | Kwon | ................ | H04N 19/86 375/240.18 |
| 2005/0243913 A1* | 11/2005 | Kwon | ............... | H04N 19/159 375/240.03 |
| 2005/0243914 A1* | 11/2005 | Kwon | ................ | H04N 19/86 375/240.18 |

(Continued)

FOREIGN PATENT DOCUMENTS

| | | | | |
|---|---|---|---|---|
| CN | 112332869 | | 2/2021 | |
| WO | WO-2021062289 A1 * | | 4/2021 | ........... H04N 19/117 |

OTHER PUBLICATIONS

R. Michael Tanner, "A Recursive Approach to Low Complexity Codes", IEEE Transactions of Information Theory, vol. IT 27, No. 5, Sep. 1981.

(Continued)

*Primary Examiner* — Samir W Rizk
(74) *Attorney, Agent, or Firm* — F. Chau & Associates, LLC

(57) ABSTRACT

A method of correcting data stored in a memory device includes: applying an iterative decoder to the data; determining a total number of rows in first data the decoder attempted to correct; estimating first visible error rows among the total number that continue to have an error after the attempt; estimating residual error rows among the total number that no longer have an error after the attempt; determining second visible error rows in second data of the (Continued)

decoder that continue to have an error by permuting indices of the residual error rows according to a permutation; and correcting the first data using the first visible error rows.

20 Claims, 16 Drawing Sheets

(56) References Cited

U.S. PATENT DOCUMENTS

2016/0182087 A1 6/2016 Sommer et al.
2017/0170849 A1 6/2017 Bentley et al.

OTHER PUBLICATIONS

Pascal O. Vontobel, et al., "Graph-Cover Decoding and Finite-Length Analysis of Message-Passing Iterative Decoding of LDPC Codes", Submitted to IEEE Transactions on Information Theory, Dec. 20, 2005.
Ramesh Mahendra Pyndiah, "Near-Optimum Decoding of Product Codes: Block Turbo Codes", IEEE Transactions on Communications, vol. 46, No. 8, Aug. 1998.
Christian Hager et al., "Approaching Miscorrection-Free Performing of Product Codes With Anchor Decoding", IEEE Transactions on Communications, vol. 66, No. 7, Jul. 2018.

* cited by examiner

ENCODING AND DECODING OF DATA USING GENERALIZED LDPC CODES

TECHNICAL FIELD

Exemplary embodiments of the present inventive concept relate to encoding and decoding of data, and more particularly to encoding and decoding of data using generalized low-density parity check codes for storage on a memory device.

DISCUSSION OF RELATED ART

Both low-density parity-check (LDPC) codes and turbo product codes (TPCs) are known for their excellent error-correction capability and their low encoding/decoding complexity. Even better error-correction capabilities can be achieved by generalized LDPC (GLDPC) codes, where local check nodes in a tanner graph are allowed to be arbitrary, as opposed to single-parity checks in "plain" LDPC codes.

In coding theory, a Hamming code is a linear error-correcting code that encodes data with parity bits. For example, a Hamming(7,4) code encodes four bits of data into seven bits by adding three parity bits. GLDPC codes based on Hamming codes provide an excellent combination of high raw bit-error rate (rBER) coverage and low encoding and decoding complexity. Due to a typical error floor, the high rBER coverage of these codes is attainable only for a moderate target frame error rate (FER) in the order of $10^{-8}$. Here, the term "error floor" refers to a situation in which below a certain FER value, it is very difficult to decrease the FER. While a moderate FER is sufficient from some applications, this is not the case for nonvolatile memories such as NAND flash memories, where a very low FER on the order of $10^{-11}$ is typically required. Thus, data cannot be encoded for storage on NAND flash memories using GLDPC codes based on Hamming codes.

SUMMARY

According to an exemplary embodiment of the disclosure, a method of processing a request by a host to access data stored in a memory device is provided. The method includes reading data from the memory device in response to the request; applying an iterative decoder to the read data; performing an error correction upon determining that the iterative decoder is oscillating; and outputting the corrected data to the host. The error correction includes determining a total number of rows in first data the decoder attempted to correct; estimating first visible error rows among the total number that continue to have an error after the attempt; estimating residual error rows among the total number that no longer have an error after the attempt; determining second visible error rows in second data of the decoder that continue to have an error by permuting indices of the residual error rows according to a permutation; determining whether zero or more first hidden error rows are present in the first data from the second visible error rows, where each hidden error row has an error and is a valid Hamming codeword; and correcting the first data using the first visible error rows and the determined number of first hidden error rows.

According to an exemplary embodiment of the disclosure, a memory system including a memory device and a controller is provided. The controller configured to read data from the memory device. The controller includes an iterative decoder. The controller is configured to apply the iterative decoder to the read data and determine whether the iterative decoder is oscillating. The controller is configured to determine a total number of rows in first data the decoder attempted to correct, estimate residual error rows among the total number that no longer have an error after the attempt, determine second visible error rows in second data of the decoder that continue to have an error by permuting indices of the residual error rows according to a permutation, determine whether zero or more first hidden error rows are present in the first data from the second visible error rows, and correct the first data using the first visible error rows and the determined number of first hidden error rows when it is determined that the iterative decoder is oscillating. Each hidden error row has an error and is a valid Hamming codeword.

According to an exemplary embodiment of the disclosure, a memory device is provided that includes a memory array, an iterative decoder, and a logic circuit configured to apply the iterative decoder to decode data read from the memory array. The logic circuit is configured to determine a total number of rows in first data the decoder attempted to correct, estimate residual error rows among the total number that no longer have an error after the attempt, determine second visible error rows in second data of the decoder that continue to have an error by permuting indices of the residual error rows according to a permutation, and correct the first data using the first visible error rows when the iterative decoder is repeatedly changing between two states during the decode.

According to an exemplary embodiment of the disclosure, a method of correcting data stored in a memory device is provided. The method includes: applying an iterative decoder to the data; determining a total number of rows in first data the decoder attempted to correct; estimating first visible error rows among the total number that continue to have an error after the attempt; estimating residual error rows among the total number that no longer have an error after the attempt; determining second visible error rows in second data of the decoder that continue to have an error by permuting indices of the residual error rows according to a permutation; and correcting the first data using the first visible error rows.

BRIEF DESCRIPTION OF THE DRAWINGS

The present inventive concept will become more apparent by describing in detail exemplary embodiments thereof with reference to the attached drawings, in which.

DETAILED DESCRIPTION

Figure 1:
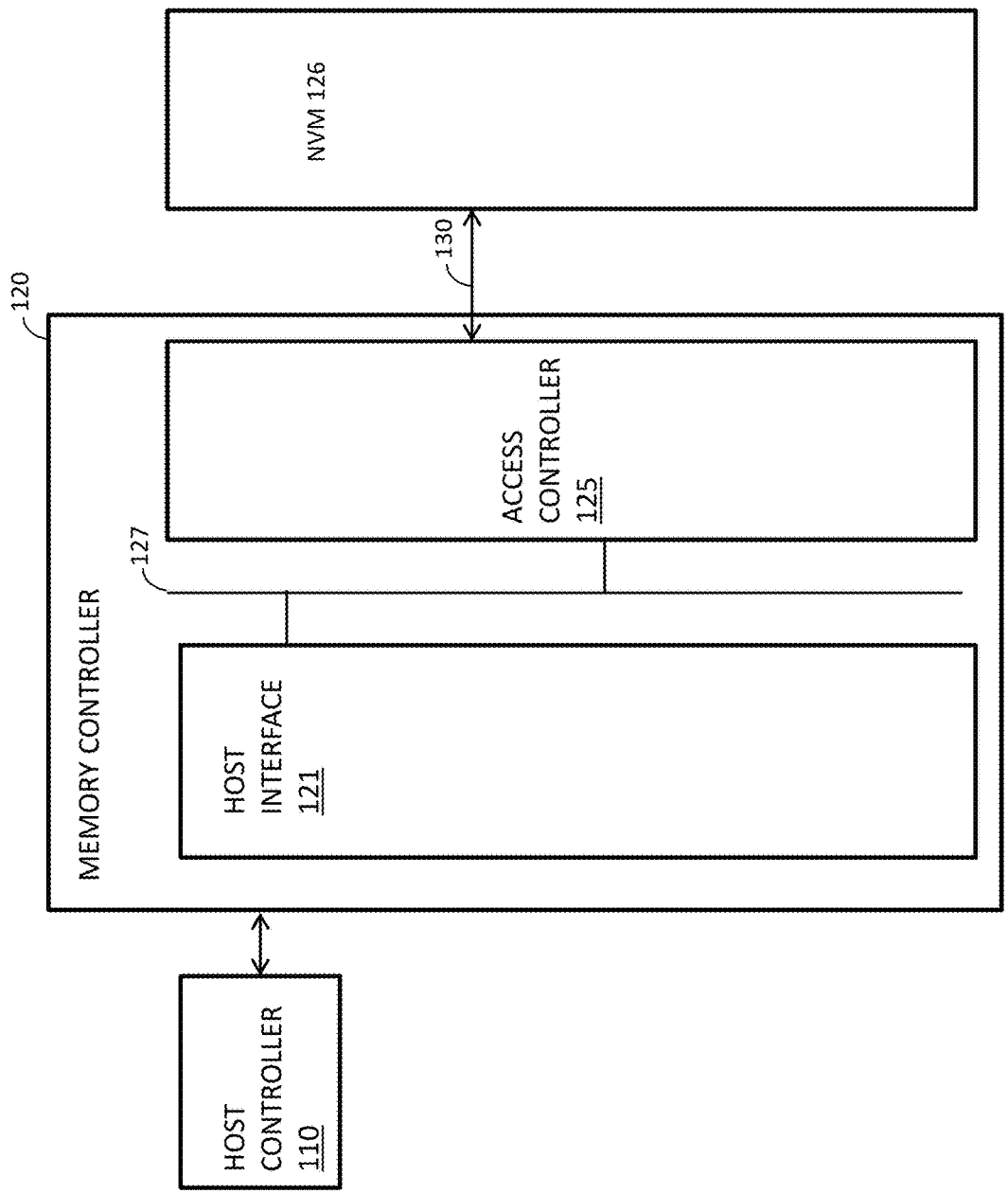
FIG. 1 is a block diagram illustrating a memory system in accordance with an exemplary embodiment of the present inventive concept.

Hereinafter, exemplary embodiments of the inventive concept in conjunction with accompanying drawings will be described. Below, details, such as detailed configurations and structures, are provided to aid a reader in understanding embodiments of the inventive concept. Therefore, embodiments described herein may be variously changed or modified without departing from embodiments of the inventive concept.

Modules in the drawings or the following detailed description may be connected with other modules in addition to the components described in the detailed description or illustrated in the drawings. Each connection between the modules or components may be a connection by communication or may be a physical connection.

FIG. 1 is a block diagram illustrating a memory system in accordance with an exemplary embodiment of the inventive concept.

Referring to FIG. 1, the memory system includes a host controller 110 and a memory controller 120 (e.g., a solid state disk (SSD) controller).

The host controller 110 controls read and write operations of the memory controller 120 and may correspond to a central processing unit (CPU), for example. The memory controller 120 stores data when performing a write operation and outputs stored data when performing a read operation under the control of the host controller 110. The memory controller 120 includes a host interface 121 and an access controller 125. The host interface 121 and the access controller 125 may be connected to one another via an internal bus 127. The access controller 125 is configured to interface with a nonvolatile memory device 126. In an exemplary embodiment, the nonvolatile memory device 126 is implemented by a flash memory device. In an alternate embodiment, the nonvolatile memory device 126 is replaced with a volatile memory but is described herein as nonvolatile for ease of discussion.

The host interface 121 may be connected with a host (e.g., see 4100 in FIG. 12) via any one of a Parallel AT Attachment (PATA) bus and Serial AT Attachment (SATA) bus. The host interface 121 may provide an interface with the access controller 125 according to the protocol of a host. The host interface 121 may communicate with the host using Universal Serial Bus (USB), Small Computer System Interface (SCSI), PCI express, ATA, Parallel ATA (PATA), Serial ATA (SATA), Serial Attached SCSI (SAS), Universal Flash Storage (UFS), or non-volatile memory express (NVMe). The host interface 121 may perform a disk emulation function which enables the host to recognize the controller 125 as a hard disk drive (HDD). In an exemplary embodiment, the access controller 125 is configured to interface with the nonvolatile memory 126 or a dynamic random-access memory (DRAM) using a Double data rate (DDR) protocol.

The access controller 125 is configured to write data to the memory device 126, and read data from the memory device 126. The memory device 126 may include one or more non-volatile memory devices.

The host controller 110 exchanges signals with the memory controller 120 through the host interface 121. The access controller 125 controls an access operation on a memory in which data will be stored within the memory device 126 when a write operation is performed and controls an access operation on a memory in which data to be outputted is stored within the memory device 126 when a read operation is performed. The memory device 126 stores data when a write operation is performed and outputs stored data when a read operation is performed. The access controller 125 and the memory device 126 communicate with one another through a data channel 130. While only a single memory device 126 is illustrated in FIG. 1, the inventive concept is not limited thereto. For example, the access controller 125 may communicate with multiple memory devices across multiple channels or with multiple memory devices across a single channel.

Figure 2A:
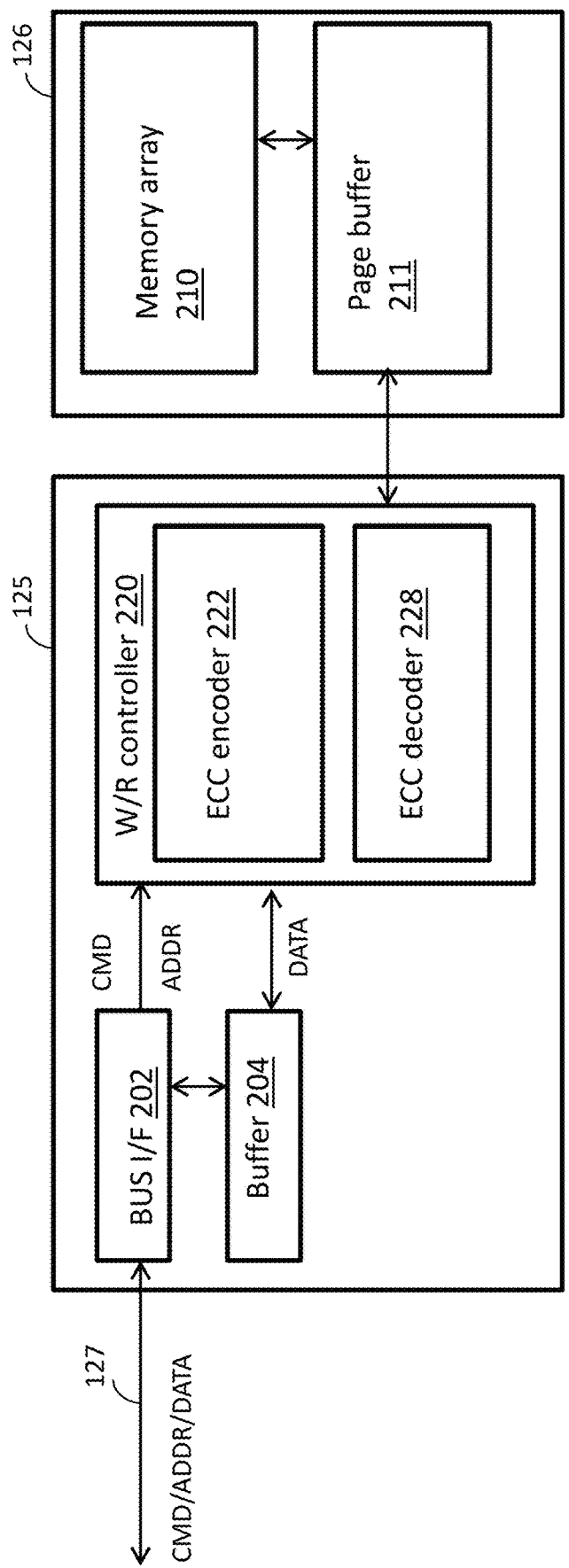
FIG. 2A is a block diagram of a controller and a memory device of FIG. 1 according to an exemplary embodiment of the inventive concept.

FIG. 2A is a block diagram of the access controller 125 and the memory device 126 of FIG. 1 according to an exemplary embodiment of the inventive concept. The read and write operations are performed in response to a command CMD, an address ADDR. The read operation reads data DATA from the memory device 126 and the write operation writes the data DATA to the memory device 126. The command CMD, the address ADDR, and the data DATA to write may be received from a host, the read data DATA may be output to the host.

Referring to FIG. 2A, the memory device 126 includes a memory array 210, and may include a page buffer 211. The access controller 125 includes a bus interface 202 (e.g., a bus controller or bus interface circuit), a buffer 204, and a write/read controller 220. The write/read controller 220 includes an error correction code (ECC) encoder 222 (e.g., an encoding circuit or a computer program) and an ECC decoder 228 (e.g., a decoding circuit or a computer program). In an exemplary embodiment, the ECC encoder 222 encodes data using a GLDPC code based on a Hamming code. In exemplary embodiment, the ECC decoder 228 is configured to decode GLDPC codes or codewords to recover the data. A decoding of the ECC decoder 228 may be iterative such that it performs a first decoding on input data in a first view (e.g., a first matrix of numbers), a permutation is performed on the first view to generate a second view (e.g., a second matrix of numbers), a second decoding is performed on the second view, and continues in this manner for a certain number of iterations until all errors have been corrected or until some number of iterations. While FIG. 2A illustrates that the ECC decoder 228 is located in the controller 125, in an alternate embodiment, the ECC decoder 228 is located within the memory device 126.

Figure 2B:
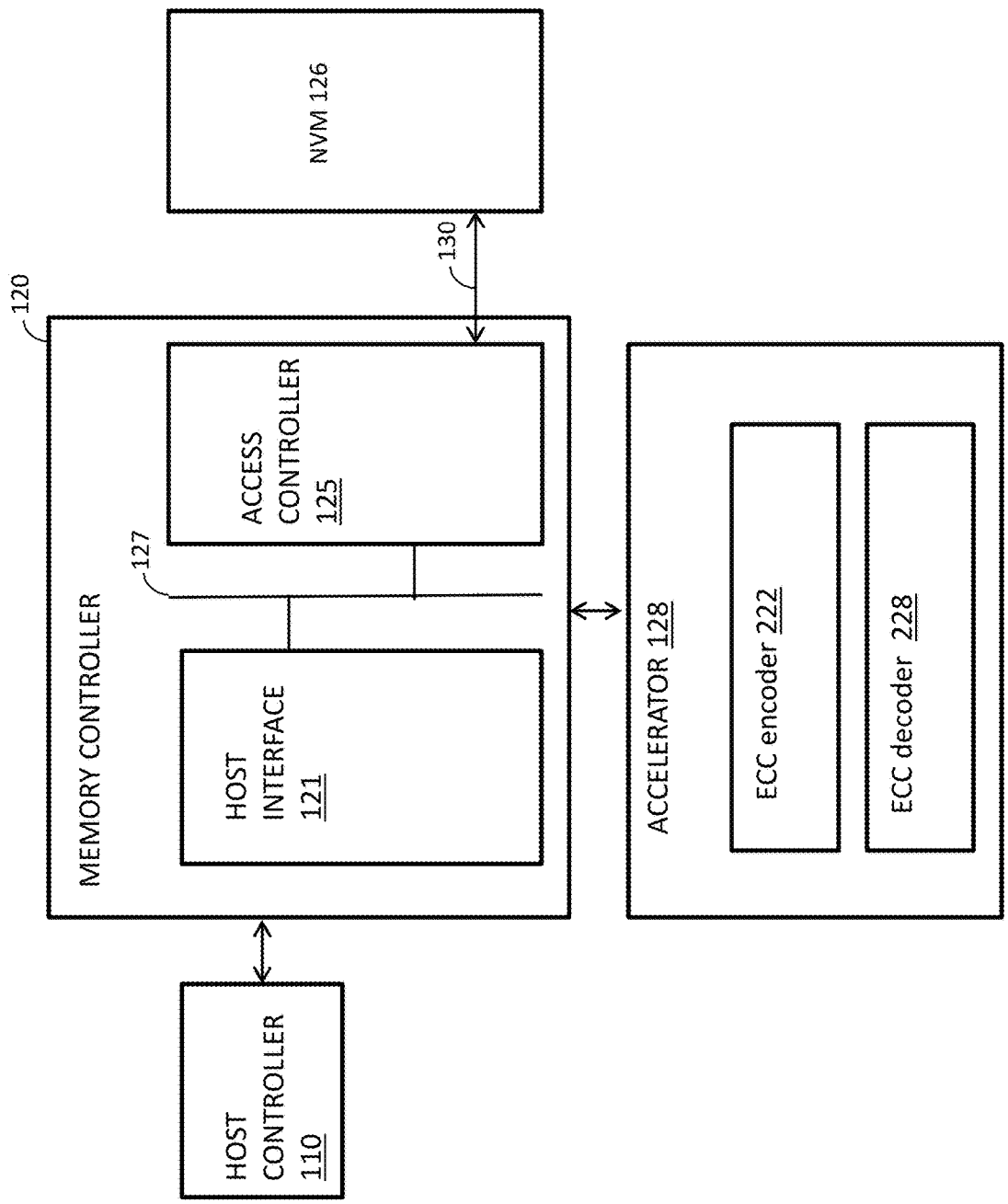
FIG. 2B is a block diagram illustrating a memory system in accordance with an exemplary embodiment of the present inventive concept.

FIG. 2B is a block diagram illustrating a memory system in accordance with another embodiment of the inventive concept. FIG. 2B is similar to FIG. 1, but it additionally includes an accelerator 128 connected to the memory controller 120. For example, the accelerator 128 may be implemented by a field programmable gate array (FPGA). The accelerator 128 includes the ECC encoder 222 and the ECC decoder 228 discussed above with respect to FIG. 2A. The accelerator 128 may receive read data from the memory device 126 through the memory controller 120. The ECC decoder 228 of the accelerator 128 may be configured to decode GLDPC codes or codewords to recover the read data. The accelerator 128 may transmit decoded read data to the host controller 110 through the memory controller 120. The accelerator 128 may receive write data from the host controller 110 through the memory controller 120. The ECC encoder 222 of the accelerator 128 may be configured to encode the write data using a GLDPC code based on a Hamming code. The accelerator 128 may send the encoded write data to the memory device 126 through the memory controller 120.

Herein, the term [n, k, d] code refers to a linear binary code of length n, dimension k, and a minimum Hamming distance d. Also, the term [n, k] code is an [n, k, d] code for some d.

Hamming Codes

A Hamming code Ham is a $[2^m-1, 2^m-m-1, 3]$ code defined by a $m \times (2^m-1)$ parity-check matrix whose $2^m-1$ columns are all non-zero binary vectors of length m, where m is some positive integer.

Extended Hamming Codes

An extended Hamming code eHam is the $[2^m, 2^m-m-1, 4]$ code obtained by adjoining a parity bit to all codewords of the Hamming code Ham.

Shortening

If C is an [n, k] code and $I \subseteq \{1, \ldots, n\}$, then the code obtained by shortening C on I is obtained by first taking only the codewords $(c_1, \ldots, c_n)$ of C with $c_i=0$ for all $i \in I$, and then deleting all coordinates from I (all of them zero coordinates). The resulting code has length n−|I| and dimension at least k−|I|. The dimension equals k−|I| if I is a subset of the information part in systematic encoding.

Shortened eH-Codes

C is a shortened eH-code if it is obtained by shortening eHam on some subset I.

eH-GLDPC Codes

For positive integers $n \leq 2^m$ and N, let $C_{rows}$ be some fixed shortened eH-code of length n, and let π be a permutation on the coordinates of N×n matrices. The eH-GLDPC code $C \subset F_2^{N \times n}$ is defined as the set of all N×n binary matrices M that satisfy the following conditions:
1. All the rows of M are in $C_{rows}$.
2. All the rows of πM are in $C_{rows}$, where πM is the matrix whose (i',j')-th entry is $M_{i,j}$ iff (i',j')=π(i,j)

The above conditions 1 and 2 refer to two different "views" of the same matrix M: In the first view (hereinafter referred to as "$J_1$"), M itself is referred to, while in the second view (hereinafter referred to as "$J_2$", the permutated version πM is referred to.

Figure 3:
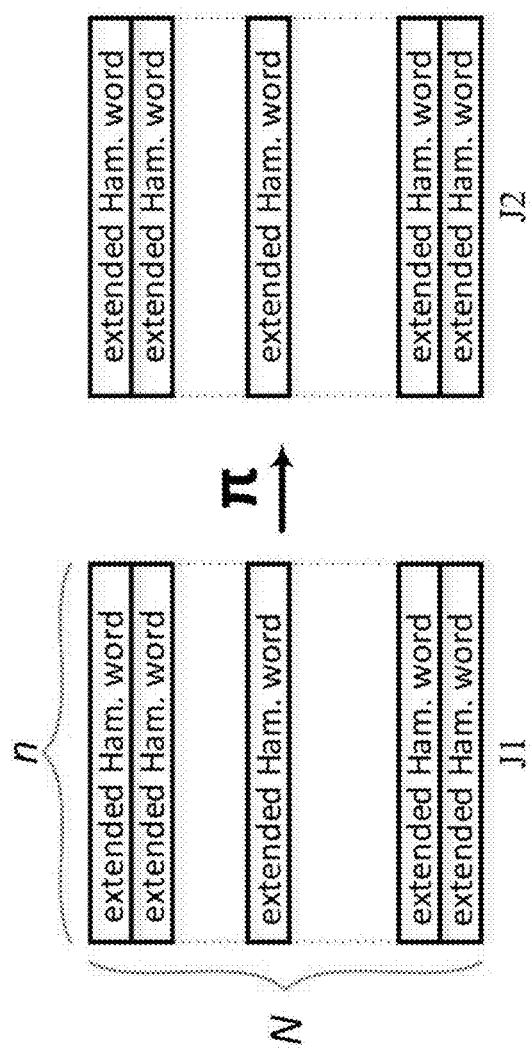
FIG. 3 illustrates a GLDPC code based on an extended Hamming code.

FIG. 3 illustrates the definition of eH-GLDPC codes. The decoding of eH-LDPC codes is performed iteratively, typically in the following scheduling: decode rows in $J_1 \rightarrow$ apply $\pi \rightarrow$ decode rows in $J_2 \rightarrow$ apply $\pi^{-1}$ . . . . This iterative process is typically continued until all rows of both $J_1$ and $J_2$ are indeed shortened-eH codewords, or until a predefined maximum number of iterations is reached. It is assumed that the permutation π satisfies Property 1 defined ahead. This property assures that the girth of the related Tanner graph is at least 8, and hence that the minimum distance of the code is at least 16.

Property 1 (Line-Intersection Property)

Figure 4:
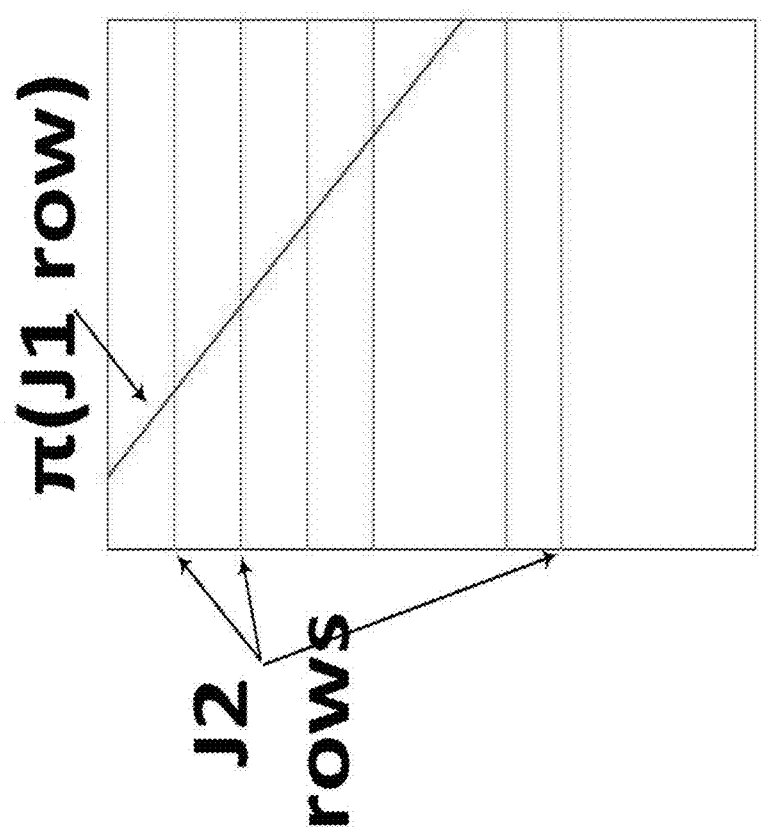
FIG. 4 illustrates the line-intersection property.

The set of indices obtained by applying a permutation π to a row intersects each row at most once. Here, a row stands for a set of indices of the form $\{(i, 1), (i, 2), \ldots, (i, n)\}$ for some $i \in \{1, \ldots, N\}$. It may be verified that π has the line-intersection property if and only if the inverse permutation $\pi^{-1}$ has the line-intersection property. Further, the property requires N≥n. The line-intersection property is illustrated in FIG. 4, which shows a row in $J_1$ is permuted by π to the diagonal line, and this line intersects each $J_2$ row (the horizontal lines) at most once.

Pseudo-Errors

A certain type of error (hereinafter referred to as "Pseudo-errors") is the reason for the error floor in eH-GLDPC codes. Pseudo-errors can be thought of as a special case of near-codewords/trapping sets, i.e., low-weight errors that violate only a very small number of local constrains. They are special in the sense that they result in oscillations between $J_1$ and $J_2$.

Figure 5:
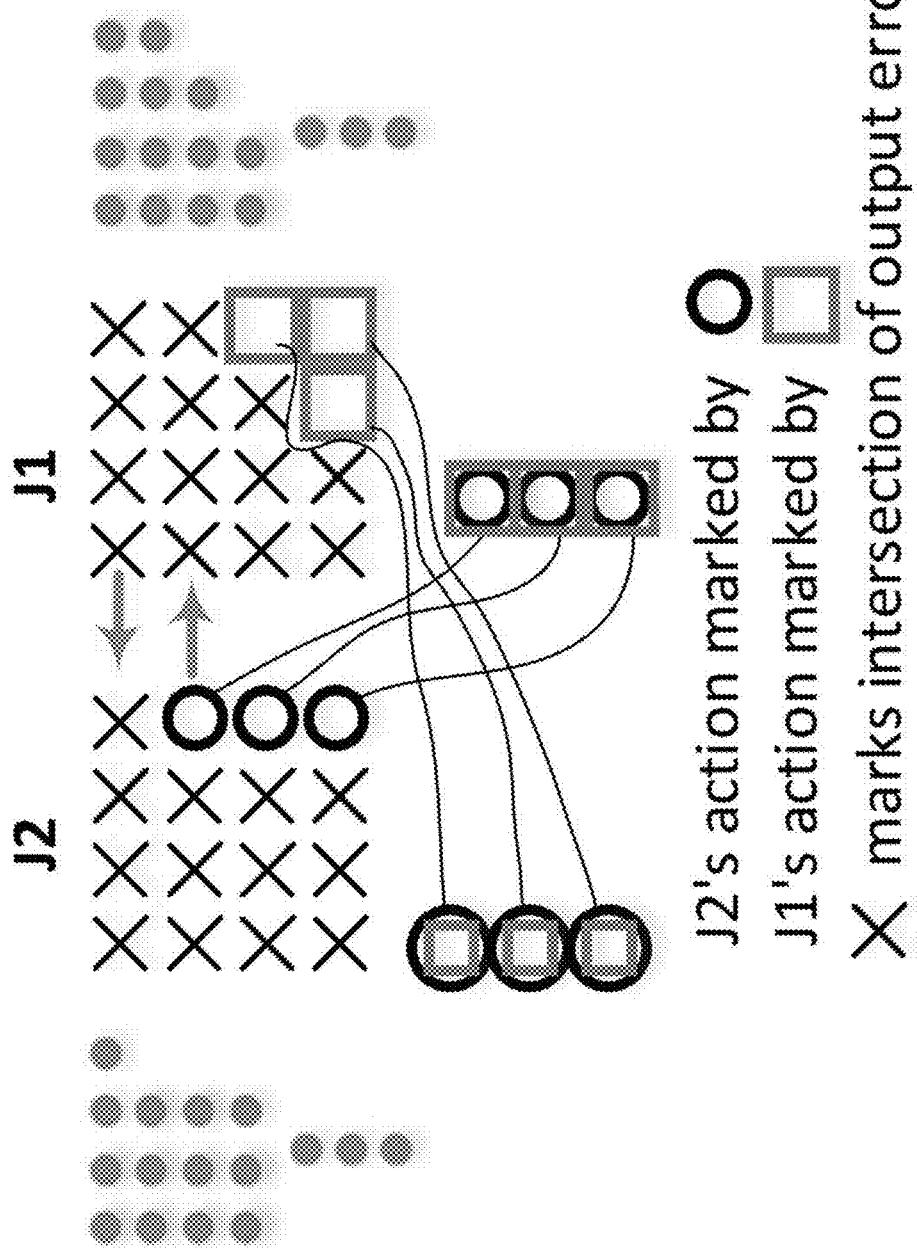
FIG. 5 illustrates an example of a pseudo-error.

FIG. 5 is an example of decoder oscillations due to a pseudo-error. An input to the decoder 228 is a matrix defined by the left-most pattern of 16 dots in FIG. 5. Here, each dot represents a "1" in an N×n matrix, and the dots are aligned for presentation convenience. For example, in the actual input pattern, arbitrary row permutations are allowed. The top row of 4 dots forms a shortened-eH codeword, while each of the three triple-dot rows can be completed to a weight-4 shortened-eH codeword (that is, the "1" completing to a weight-4 extended Hamming codeword does not fall in the shortened indices). The input to the decoder may also include soft reliability information on top of the "hard" bits such as log-likelihood ratios LLRs). With the above input, the decoder 228 is not able to correct the first row since it is already a shortened-eH codeword, corrects the second through fourth weight-3 rows to the nearest weight-4 codewords (e.g., by flipping a 0 bit to 1), and corrects the fifth through seventh weight-1 rows to an all-zero codeword. After an action of the decoder 228, the remaining pattern will be the 4×4 top pattern below the title "$J_2$" in the figure, consisting of 13 X's (representing untouched "1"s from the input pattern), and 3 O's, representing "1"s created by decoding $J_2$. It is assumed that the three "1"s in the o's appearing after a decoder action on $J_1$ are mapped back to three separate rows in $J_2$, then we are back to the original situation in $J_2$, and it is clear that the decoder 228 will proceed by oscillating between $J_1$ and $J_2$ as described above.

Figure 6:
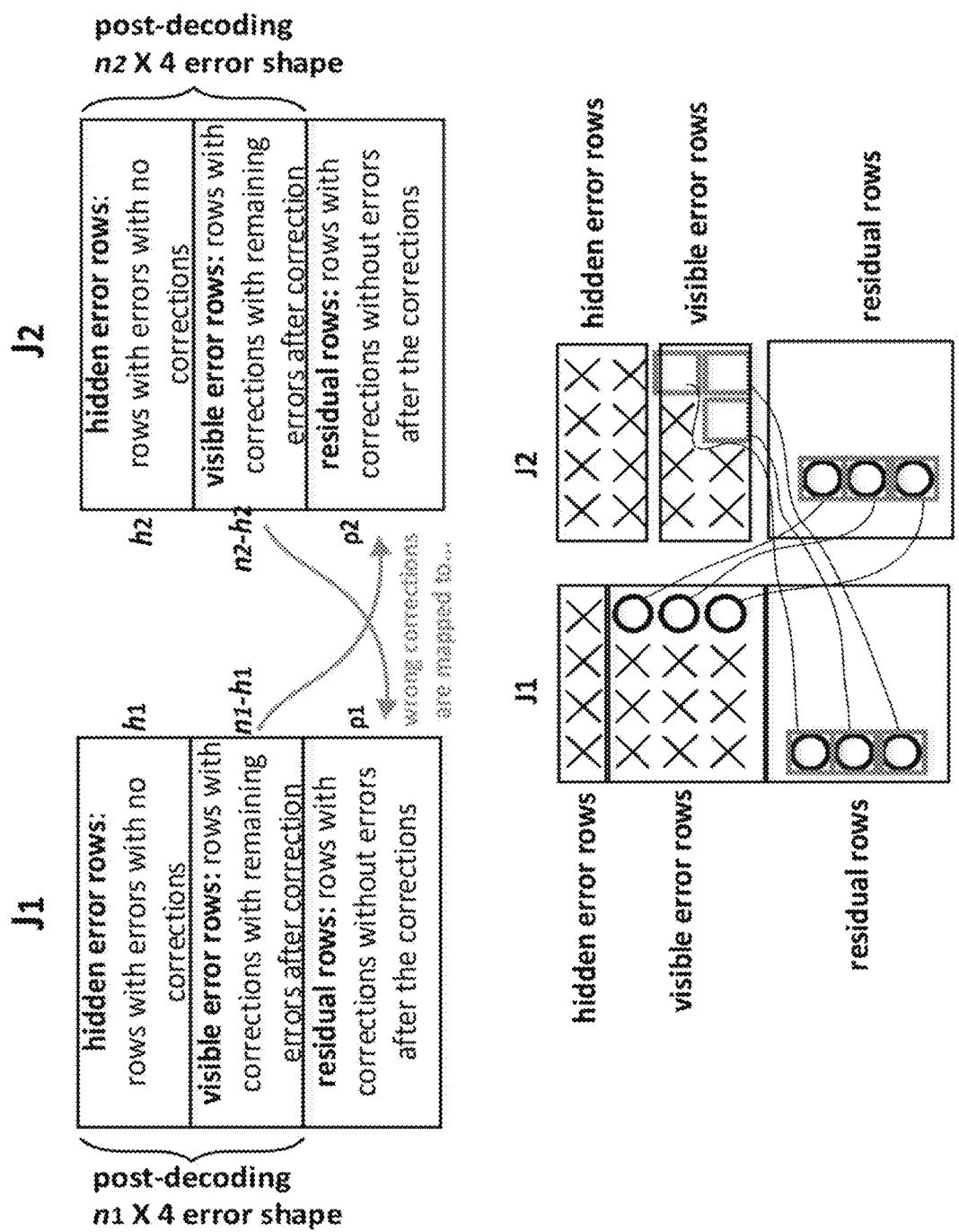
FIG. 6 illustrates different types of rows in a pseudo-error.

By definition, a pseudo-error is an error pattern (say, at $J_1$) that results in decoder oscillations. Pseudo-errors for which the post-decoding patterns at $J_i$ (i=1, 2) have only rows of weight 4 are considered herein. The pre-decoding pseudo-error at $J_i$ (i=1, 2) as illustrated in FIG. 6 may be divided into $h_i$ hidden error rows, visible error rows, and residual error rows pi. The total number of rows including errors after $J_i$'s decoder action is denoted $n_i$. The hidden error rows $h_i$ at $J_1$ are shortened-eH codewords, and therefore "invisible" to $J_i$'s decoder. In an embodiment, a hidden error row $h_i$ is data with 4 bit errors, is a valid shortened-eH codeword, and the decoder is not able detect errors in a valid shortened-eH codeword. There are $n_i-h_i$ visible error rows, that is, rows in which the decoder 228 acts on $J_i$, but with remaining errors after the decoding. There are pi residual error rows, that is, rows in which the decoder 228 acts on $J_i$ appropriately and corrects all errors.

In an embodiment, pseudo-errors with two properties are considered: i) in visible-error rows, there are only wrong corrections (e.g., all bits flipped by the decoder 228 should not have been flipped); and ii) all visible-error (wrong) corrections are mapped through π or $\pi^{-1}$ (depending on whether i equals 1 or 2, respectively) to rows without an "X", where an X marks an error present both before and after the decoding.

Figure 7:
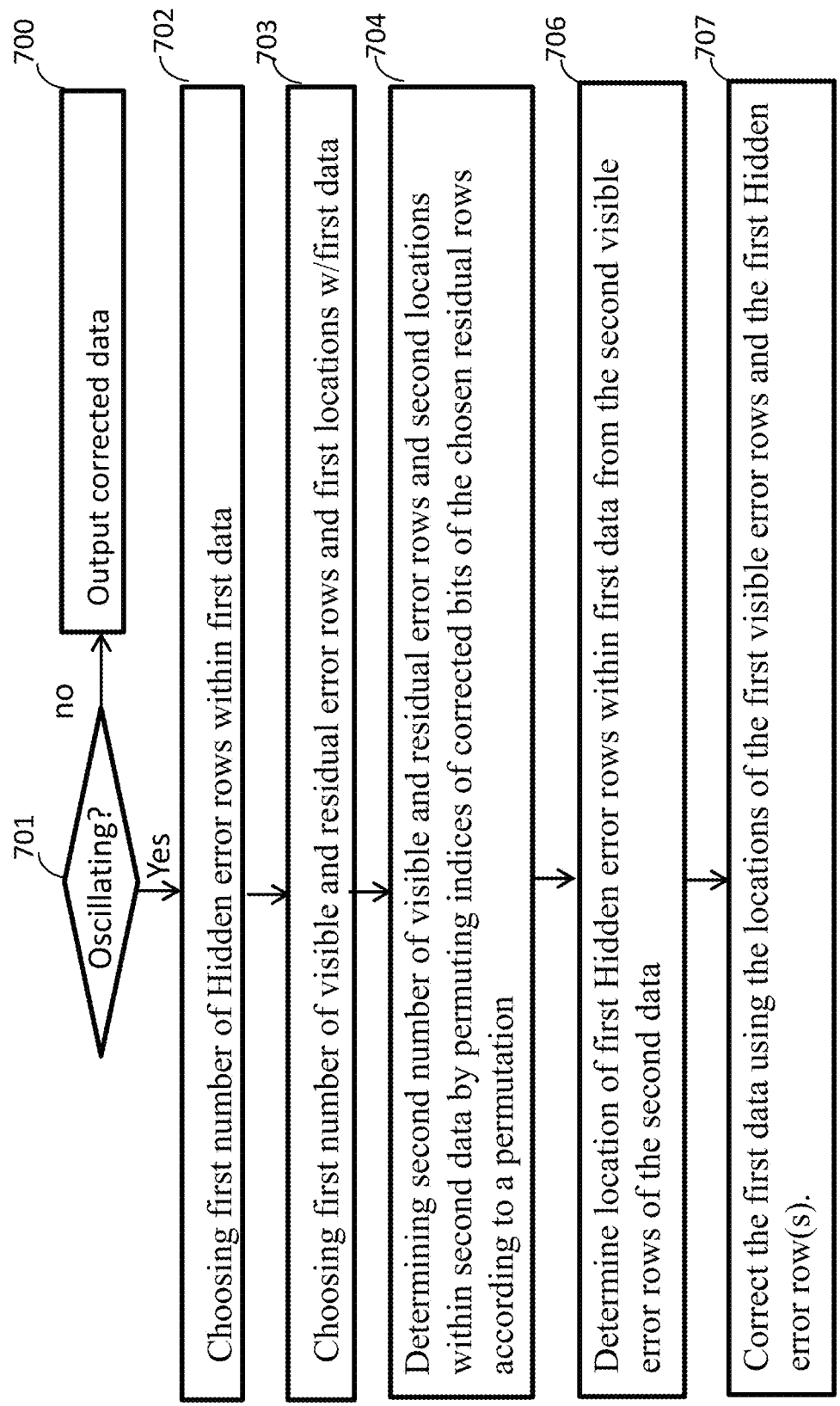
FIG. 7 illustrates detecting and correcting pseudo-errors according to an embodiment of the disclosure.

FIG. 7 illustrates a method of detecting and correcting pseudo-errors according to an embodiment of the disclosure.

The method of FIG. 7 includes determining whether the iterative decoder is oscillating (step 701). In an embodiment, the decoder 228 of FIG. 2A or FIG. 2B (e.g., an iterative decoder) is determined to be oscillating when it repeatedly changes between the same two states. For example, if the decoder 228 could be considered to be oscillating if it reaches a first state where it has flipped bits having first, third, and fifth positions in a first row of the first data, continues to a second state where it has flipped bits having second, fourth, and seventh positions in a first column of the second data, returns to the first state, etc. For example, the W/R controller 220 or access controller 125 of FIG. 2A could determine whether the decoder 228 of FIG. 2A is oscillating or the accelerator 228 of FIG. 2B could determine whether the decoder 228 of FIG. 2B is oscillating. If the decoder 228 is not oscillating and all GLDPC constraints are satisfied, the output of the decoder 228 may be corrected data without any errors (step 700). If the decoder 228 is not oscillating and all GLDPC constrains are not satisfied, the data could not be corrected, and the method may exit. It is assumed that during the oscillating, the decoder 228 records the bits it has corrected in a first view $J_1$ and their locations within the rows of data operated on (e.g., first recorded information) and that the decoder 228 records the bits it has corrected in a second view $J_2$ and their locations within the rows of data operated on (e.g., second recorded information). A location of a bit may indicate the row the bit is located within and a column within that row. For example, the recorded information may be temporarily stored in buffer 204. The first recorded information may indicate how many rows of the first view $J_1$ the decoder 228 attempted to correct and the second recorded information may indicate how many rows of the second view $J_2$ the decoder 228 attempted to correct.

The method of FIG. 7 includes choosing a first number (e.g., $H_1$) of hidden error rows within first data (e.g., $J_1$) operated on by the iterative decoder (e.g., 228) (step 702). The chosen first number of hidden error rows is a guess. For example, if the guess assumes there is only 1 hidden error row, but there are in fact 2 hidden error rows, the guess will end up being a wrong guess. Thus, the method of FIG. 7 could initially set $H_1$ to 0 in a first iteration, and then to 1 in a second iteration if the first guess is wrong. For example, the choosing of the first number could be performed by the ECC decoder 228.

The method of FIG. 7 further includes choosing a first number (e.g., $K_1$) of visible error rows and residual error rows and their locations within the first data (step 703). The first number of visible error rows is based on the number of rows of the data that the decoder 228 attempted to correct. For example, $K_1$ could be 1, 2, 3, 4, or 5 if the first recorded information indicates that bits in 6 rows were flipped by the decoder as shown under $J_1$ in FIG. 6. The chosen first number of visible error rows is a guess. For example, if the guess assumes there is only 1 visible error row, but there are in fact 3 visible error rows, the guess will end up being a wrong guess. Thus, the method of FIG. 7 could initially set $K_1$ to 1 in a first iteration, and then to 2 in a second iteration if the first guess is wrong, and then to 3 in a third iteration if the second guess is wrong, etc. The number of residual error rows (e.g., $\rho_1$) within the first data is based on the chosen number of visible error rows and the number of rows of the data that the decoder attempted to correct. For example, the first number of residual error rows may be calculated by subtracting the chosen first number of visible error rows from the total number of corrected rows. For example, if 3 visible error rows are chosen as having locations of the second through fourth rows from among 6 corrected rows, then it would be determined that there are 3 residual error rows having locations of the fifth through seventh rows. For example, the choosing of the first number of visible error rows and residual error rows and their locations could be performed by the ECC decoder 228.

The choosing of the number of hidden error rows, the choosing of the number of visible errors rows and their locations, and the choosing of the number of residual errors rows and their locations, may be referred to as selecting parameters for a scan.

The method of FIG. 7 further includes determining a second number of visible error rows and their locations (e.g., indexes) within second data (e.g., $J_2$) operated on by the iterative decoder and a second number of residual errors in the second data and their locations within the second data by permuting indices of the corrected bits of the chosen residual rows according to a permutation (e.g., π). The iterative decoder operating on the first data $J_1$ generates the second data $J_2$. The indices or locations of the touched bits of the chosen residual rows (i.e., bits the decoder flipped as an attempt to correct them) are stored in the first record information created during normal operation of the iterative decoder 228 operating on $J_1$ while oscillating in its attempt to correct input data. For example, as shown in FIG. 6, the touched bits in the fifth through seventh rows of $J_1$ chosen as residual error rows map to the third and fourth rows of $J_2$ according to the permutation. A permutation causes numbers in a first matrix to be reordered so they have different positions in a second matrix. For example, the touched bit of the first residual row is in a fifth row and first column in $J_1$, but in a third row and fourth column in $J_2$ due to the permutation. For example, the determining of the second number of visible error rows and their locations within the second data could be performed by the ECC decoder 228.

The method of FIG. 7 further includes determining the location of the first hidden error rows within the first data using the visible error rows of the second data (step 706). The location of the first hidden error rows may be determined additionally using the visible error rows of the first data. The determining of the location of the first hidden error rows within the first data using the visible error rows of the second data could be performed by the ECC decoder 228.

The method of FIG. 7 further includes correcting the first data using the locations of the first visible error rows and the locations of the first hidden error rows (step 707). When no hidden error rows are found, the first data may be corrected using only the locations of the first visible error rows.

Figure 8:
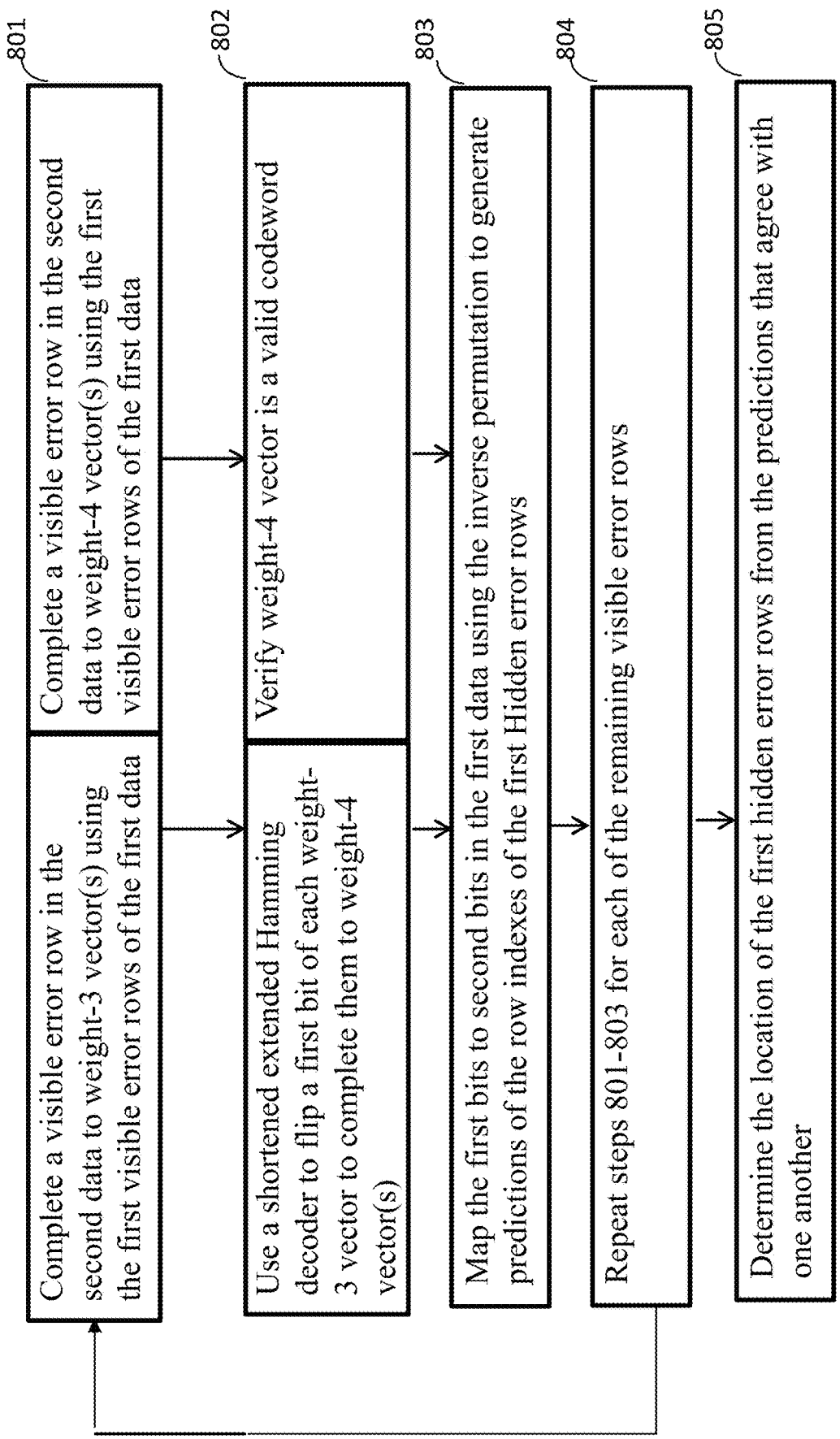
FIG. 8 illustrates a method of determining a location of Hidden error rows according to an embodiment of the disclosure that may be used in the method of FIG. 7.

FIG. 8 illustrates a method of implementing step 706 to determine the location of the first Hidden error rows. For example, the method of FIG. 8 could be performed by the ECC decoder 228 located in the access controller 125 or located in the accelerator 128.

The method of FIG. 8 includes completing a visible error row to one or more weight-3 vector(s) using the visible error rows of the first data, when hidden error rows have been determined to be present (left side of step 801). For example, as shown in FIG. 6, the second visible error row includes two corrected bits illustrated as squares, and one of the other bits can be flipped to convert the weight-2 vector into a weight-3 vector. The third bit is flipped in the location of an intersection with the π-image of one of the visible error rows of $J_1$.

The method of FIG. 8 further includes using a Hamming decoder to flip a first bit of each weight-3 vector to generate weight-4 vector(s) (left side step 802). In an embodiment, the Hamming decoder is a shortened extended Hamming decoder or configured to decode a shortened extended Hamming codeword.

If hidden error rows are not present, then step 801 includes completing a visible error row in the second data to a weight-4 vector using the first visible error errors of the first data (see right side of 801). Then it is verified whether the weight-4 vector is a valid codeword in step 802 (see right side of 802).

The method of FIG. 8 further includes mapping each of the first bits to second bits in the first data using the inverse permutation to generate predictions of the row indexes of the first Hidden error row (step 803).

The method of FIG. 8 further includes repeating steps 801-803 for each of the remaining visible error rows (step 804).

The method of FIG. 8 further includes determining the location of the hidden error rows from the predictions that agree with one another (step 805). For example, if the predictions derived from one visible error row of the second data indicate the hidden error row is located in the first row and the second row of $J_1$ in FIG. 6 and the predictions derived from another visible error row of the second data indicate the first row and the third row, it can be concluded that the hidden error row is located the first row.

Figure 9:
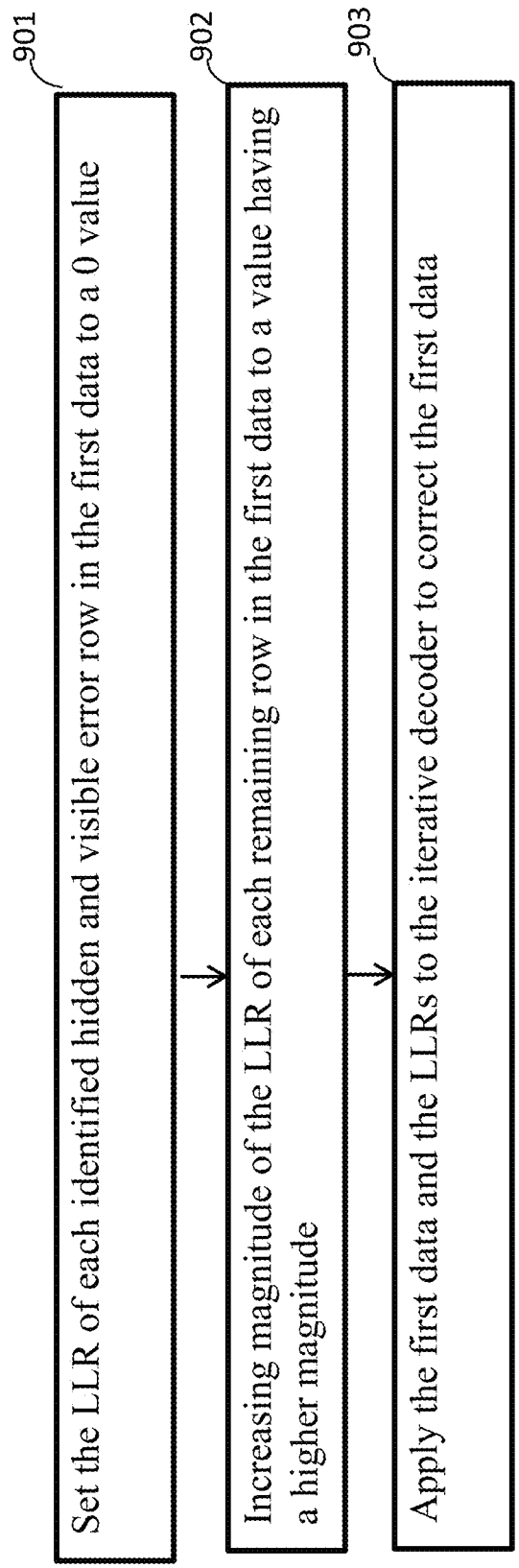
FIG. 9 illustrates a method of correcting data using estimated locations of visible error rows and Hidden error rows, according to an embodiment of the disclosure.
Figure 10:
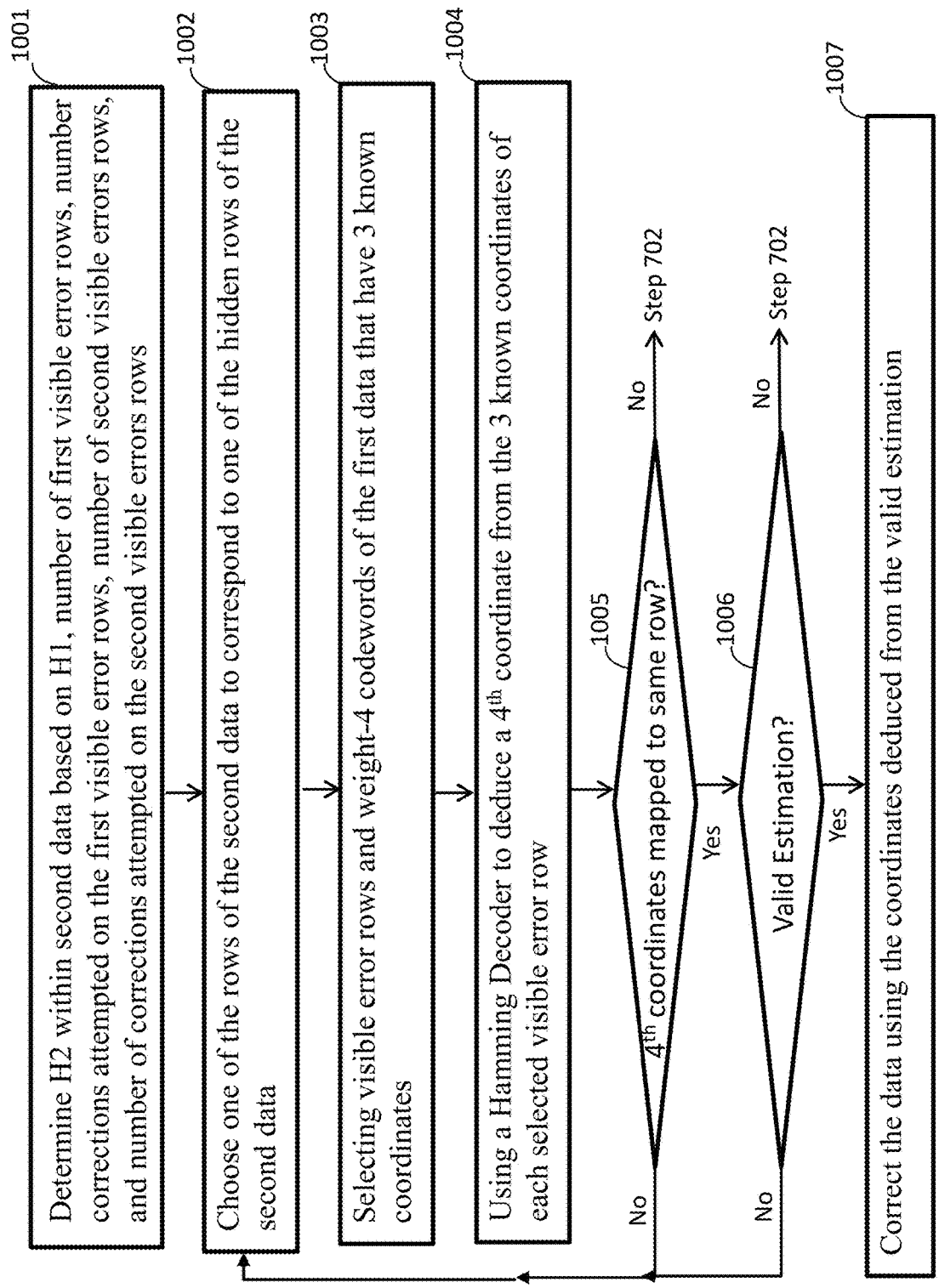
FIG. 10 illustrated another method of correcting data using estimated locations of visible error rows and Hidden error rows, according to an embodiment of the disclosure.

As discussed above, step 707 of FIG. 7 corrects the first data using the locations of the first visible error rows and the locations of the first hidden error row(s). FIGS. 9 and 10 illustrate a method to implementing step 707, which corrects the first data using estimated locations of visible error rows and the hidden error rows.

The method of FIG. 9 includes setting the LLR of each identified hidden error row and visible error row in the first data to 0 (step 901).

The method of FIG. 9 further includes increasing a magnitude of the LLR of each the remaining rows in the first data to a value having a higher magnitude (step 902). For example, if the LLR of a first one of the remaining rows is −0.5 and the LLR of a second one of the remaining rows is −0.4, then both could be set to −1. For example, if the LLR of a third one of the remaining rows is +0.2 and the LLR of a second one of the remaining rows is +0.3, then both could be set to +1. Thus, the LLR is essentially increased to a maximum value and the sign is maintained. For example, if the LLR supports a maximum negative value of −1 and a maximum positive value of +1, the LLR is given the maximum negative value if it is negative and the maximum positive value if it is positive. Please note that use of a maximum negative value of −1 and a maximum positive value of +1 is merely an example since various other values may be used. The remaining rows may include the previously identified residual error rows.

The method of FIG. 9 further includes applying the first data and the LLRs to the iterative decoder to correct the first data (step 903).

FIG. 10 illustrates a method of correcting data according to an embodiment of the disclosure.

The method of FIG. 10 includes determining a second number of hidden error rows (e.g., $H_2$) within the second data based on the number of first hidden error rows (e.g., $H_1$), the number of first visible error rows, the number of corrections made to the first visible error rows, the number of second visible errors rows, and the number of corrections made to the second visible errors rows (step 1001). The second number of hidden error rows (e.g., $H_2$) may be calculated by assuming that hidden error rows include 4 errors, that the decoder completes a visible error row into a shortened extended hamming codeword and using Equation 1 below.

$$4H_\ell + \sum_{j=1}^{3} \#$$

(visible error rows in side with $\ell$ with $j$ corrections)·

$$(4-j) = 4H_{\bar{\ell}} + \sum_{j=1}^{3} \#$$

(visible error rows in side $\bar{\ell}$ with $j$ corrections)·$(4-j)$ [Equation 1]

As shown in FIG. 6, side $\ell$ may correspond to J1 and side $\bar{\ell}$ may correspond to J2. Since 1 correction $j$ was made to each of the 3 visible error rows $K_1$ in J1, and one hidden row $H_1$ with 4 errors was chosen, and each of the 3 visible error rows were completed to a weight-4 codeword, the left side of Equation 1 reduces to 13 errors. For example, $4H_1+3*(4-1)=13$. The right side of Equation 1 reduces to $4H_2+5$ since J2 includes two visible errors rows where the first visible error row had 1 correction and the second visible error row has 2 corrections. For example, $4H_2+1*(4-1)+1*(4-2)=4H_2+5$. $H_2$ is then determined to be 2 since $4H_2+5=13$. Equation assumes that the number errors in $J_1$ is equal to the number of errors in $J_2$.

The method of FIG. 10 includes choosing one of the rows of the second data to correspond to one of the hidden rows of the second data (step 1002). The chosen row may exclude the rows in $J_2$ where the decoder acted.

The method of FIG. 10 further includes selecting visible error rows of the first data that have 3 known coordinates (step 1003). The selecting may also include selecting the weight-4 codewords (i.e., the no longer hidden error rows). The selecting may be performed from: (1) the prior actions of the decoder that flipped bits and bit locations of oscillating errors, (2) coordinates found in the course of the steps of FIG. 8 and were mapped back to the first data, and (3) the intersection with the chosen scanned row in the second data if the number of second hidden error rows $H_2$ equals 2. The 3 known coordinates are locations of 3 bits within a row of the first data that have been determined to have an error.

The method of FIG. 10 further includes using a Hamming decoder to deduce a fourth coordinate from the 3 known coordinates of each selected visible error row (step 1004). The Hamming decoder may perform a decoding on 3 known coordinates based on a shortened extended Hamming code to deduce the fourth coordinate.

The method of FIG. 10 further includes determining whether the fourth coordinates are all mapped to a same row in the second data (step 1005). If they do not all map to the same row, the method discards the choice of row and resumes to step 1002 to choose another row if the number of second hidden error rows $H_2$ equals 2 and not all rows were scanned or resumes to step 702 of FIG. 7 if $H_2<2$ or if $H_2=2$ and all rows were scanned. If the fourth coordinates are all mapped to a same row, then this row is a potential estimation for the location of a second hidden error row.

The method of FIG. 10 further includes verifying whether the potential estimation is a valid estimation (step 1006). If the fourth coordinates are all mapped to a same row in the second data, the verifying may include determining whether the resulting four coordinates in a same row define a Hamming codeword of weight 4. If not, the method discards the choice of row and resumes to step 1002 to choose another row if $H_2=2$ or resumes to step 702 of FIG. 7 if $H_2<2$ or $H_2=2$ and all rows were scanned. The verifying may further include, if $H_2=2$, checking if an intersection of the scanned row of the second data with the permutated visible error rows (or with a hidden error row) of the first data define a valid weight-4 Hamming codeword in the scanned row of the second data. If not, the method discards the choice of row and resumes to step 1002 to choose another row if $H_2=2$ or resumes to step 702 of FIG. 7 if $H_2<2$ or $H_2=2$ and all rows were scanned.

The method of FIG. 10 then corrects the first data using the coordinates deduced from the potential estimation if the verifying concludes the potential estimation is a valid estimation (step 1007). Each deduced coordinate may indicate a location of a given row within the first data and a bit location within the given row. For example, in FIG. 6, if the rows are sequential, begin at the first row, and show the first 4 bits of every row, then on the left side there would be 4 deduced coordinates having a row index of 1 with bit positions of 1-4, 3 deduced coordinates having a row index of 2 with bit positions of 1-3, 3 deduced coordinates having a row index of 3 with bit positions of 1-3, and 3 deduced coordinates having a row index of 3 with bit positions of 1-3. The correcting of the data is then performed by flipping the bits having these bit positions within the first data. However, FIG. 6 need not be illustrating sequential rows or sequential bits. For example, the first illustrated row could correspond to a $10^{th}$ row within the first data and the second illustrated row could correspond to a $19^{th}$ row within the first data. For example, the first X in the first row could correspond to a bit having a $100^{th}$ bit position in the $10^{th}$ row, the second X in the first row could correspond to a bit having a $112^{th}$ bit position in the $10^{th}$ row, the first X in the second row could correspond to a bit having a $50^{th}$ bit position in the $19^{th}$ row, the second X in the second row could correspond to a bit having a $62^{th}$ bit position in the $19^{th}$ row, etc.

Figure 11A:
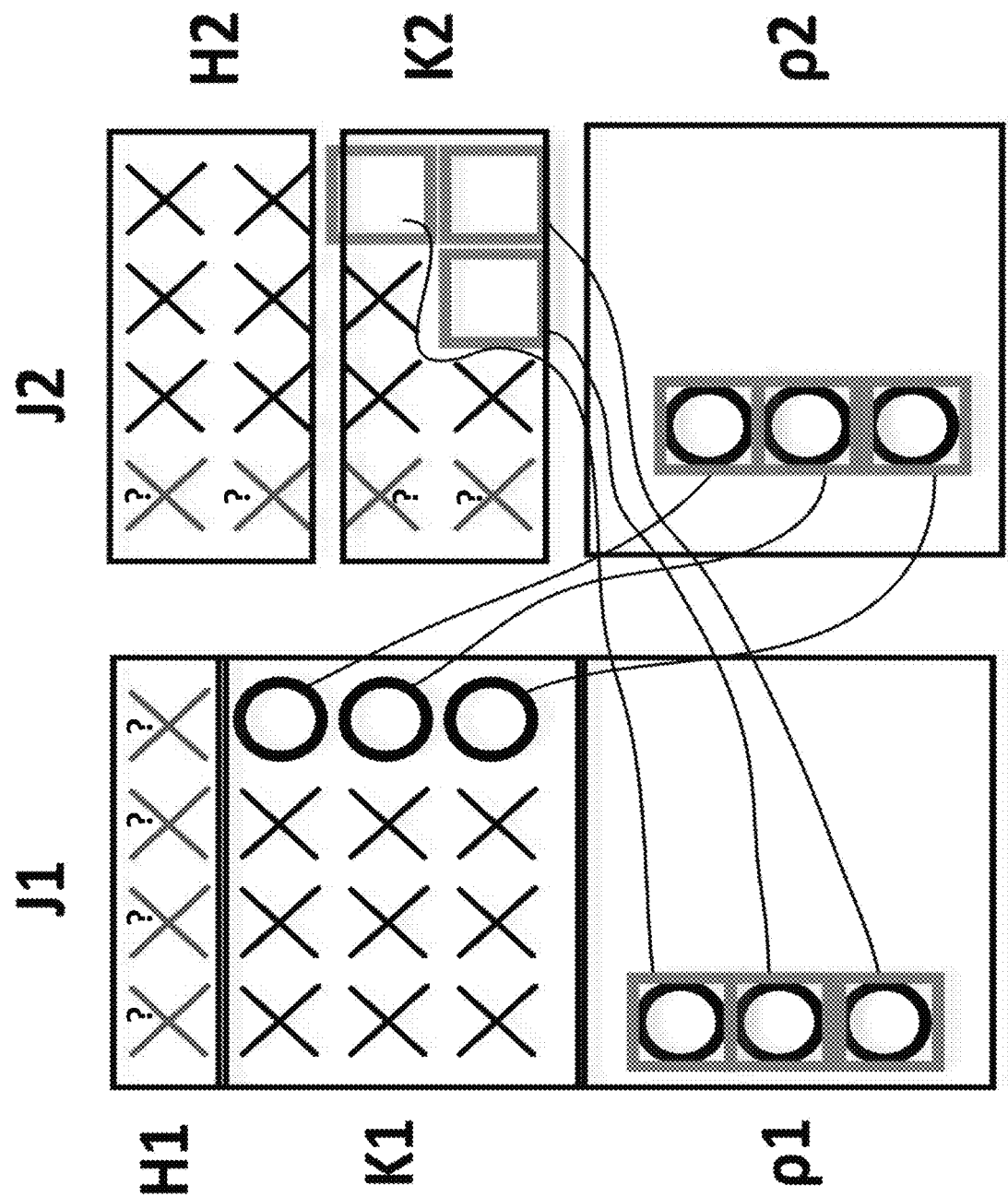
FIG. 11A and FIG. 11B illustrate steps used to deduce coordinates of errors according to an embodiment of the disclosure.
Figure 11B:
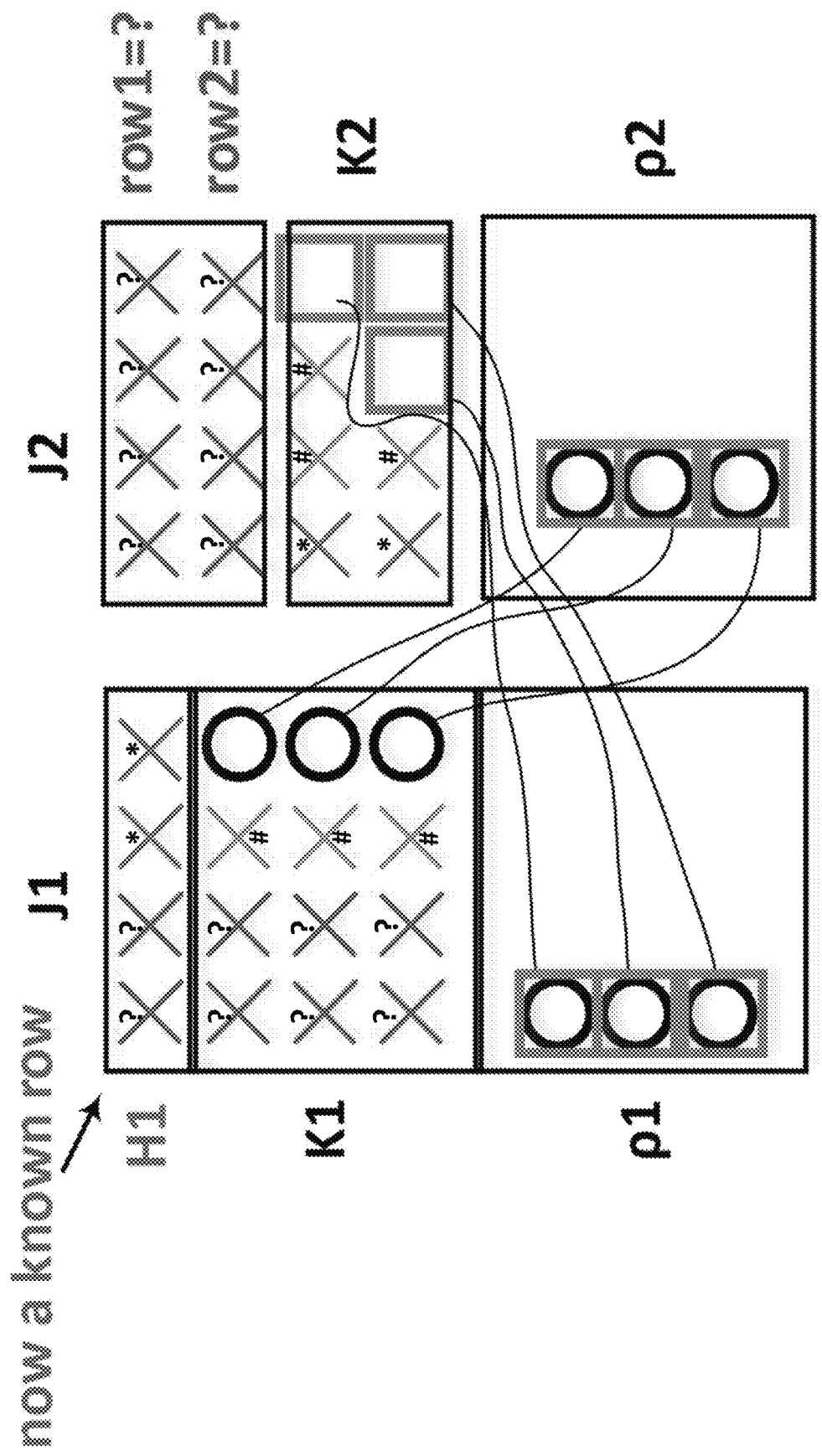

FIG. 11A and FIG. 11B illustrate steps of FIG. 10 used to deduce the coordinates of the errors after a given set of the scanning parameters has been selected.

In FIG. 11A, it is observed that the 4 X's (marked with a '?') of the single hidden row of $J_1$ is mapped to a single X in each one of the 4 X-rows of $J_2$ (marked with a '?'). As a matter of notation, one will sometimes say that the hidden error row of $J_1$ intersects all 4 X-rows of $J_2$.

In the general case, if the number of X rows of $J_{\bar{\ell}}$ is larger than 4, then an additional scan over $$M := \binom{\#(X \text{ rows of } J_{\bar{\ell}})}{4}$$

intersection options is required, and in what follows one considers the case where the scan hits the correct option. Note also that #(X rows of $J_{\bar{\ell}}) = H_{\bar{\ell}} + K_{\bar{\ell}}$ is assumed to be known at this stage, since both $H_{\bar{\ell}}$ and $K_{\bar{\ell}}$ have been calculated from the current values of the scanned parameters.

In each instance of this scan over M options, for each of the $K_{\bar{\ell}}$ visible error rows of side $\bar{\ell}$ there is either 0 or 1 X's coming from the hidden error row of $J_{\ell}$, in case $H_{\ell}=1$. In case $H_{\ell}=0$, it is clear that there are 0 X's from hidden error rows of $J_{\ell}$ in each visible error row of side $\bar{\ell}$, as there are no hidden error rows of $J_{\ell}$. This is included in the more general case where each visible error row of side $\bar{\ell}$ has either 0 or 1 X's from visible error rows of $J_{\ell}$. Therefore, unless noted otherwise, it is assumed that $H_{\ell}=1$.

It is noted that all the X's in the $K_{\bar{\ell}}$ visible error rows of $J_{\bar{\ell}}$ not coming from the hidden error row of $J_{\ell}$ comes from the $K_{\ell}$ visible error rows of $J_{\ell}$, and by assumption, each such row intersects each visible error row of $J_{\bar{\ell}}$ at most once, in a known coordinate.

In what follows, one can simultaneously recover, in $J_{\bar{\ell}}$, the X's from the visible error rows of $J_{\ell}$, and the identity of the hidden error row of $J_{\ell}$ (if it exists). Moreover, one can reconstruct some unknowns in several different ways, and checking if the resulting values for the same unknown are the same will be used as a criterion for screening out wrong assumptions.

A visible error row is fixed in $J_{\bar{\ell}}$ and it is assumed that the decoder flipped $m_{\square} \in \{1,2,3\}$ coordinates in this row. For example, in FIG. 6, there is one visible error row with $m_{\square}=1$ flips ($\square$'s), and one row with $m_{\square}=2$ flips. In this row of $J_{\bar{\ell}}$, a shortened-eH word of weight 4 has exactly the following "1"s: i) Up to one X from the hidden error row of $J_{\bar{\ell}}$ such an X is assumed iff if $H_{\ell}=1$ and the current value of the scan over M options described above implies that this visible error row of $J_{\bar{\ell}}$ indeed intersects with the hidden error row of $J_{\ell}$ (e.g., $m_h \in \{0,1\}$ is written for the number of X's from the hidden error row of $J_{\ell}$), ii) exactly $m_{\square}$ $\square$'s, and iii) exactly $m_a := 4 - m_{\square} - m_h$ X's coming from the visible error rows of $J_{\bar{\ell}}$, each such X coming from a different row of $J_{\bar{\ell}}$.

The algorithm may then run on all the visible error rows of $J_{\bar{\ell}}$ as follows:

For each such row, the algorithm runs on $$\binom{K_{\ell}}{m_a}$$

choices of $m_a$ rows out of the $K_{\ell}$ visible error rows of $J_{\ell}$

For each choice in the above scan if not all $m_a$ chosen rows intersect with the fixed row of $J_{\bar{\ell}}$, then discard this option Otherwise, if $m_h=0$, check if the 4 coordinates obtained by the $m_a$ intersecting rows+$m_{\square}$ $\square$'s form a shortened-eH codeword. If not, then discard this choice and proceed to the next choice. If they do form a codeword, then keep this as a hypothesis for $m_a$ X's from the visible error rows of $J_{\ell}$ Otherwise if $m_h=1$, then complete the total of $3=m_a+m_{\square}$ coordinates to a weight-4 shortened eH-codeword. If no such completion exists within the shortening, then discard this choice and proceed to the next choice. If an option exists, then keep it as a potential estimation for the X coming from the hidden error row of $J_{\ell}$ If all options are discarded for some row, then move up to the last scanned variable (from those we have considered fixed), discard its current value and proceed to the next value If more than one row had $m_h=1$, then verify that the resulting estimations of the hidden row of $J_\ell$ agree. Otherwise, move up to the last scanned variable, discard its current value and proceed to the next value Typically, and with high probability, only the correct solution will not be screened out by the above process. In addition, if one of the fixed parameters from outer scans is incorrect, then typically all solutions will be screened out, and it will be clear than the decoder must proceed to the next hypothesis.

For example, in FIG. 6, there are 2 visible error rows in $J_2$, and 3 visible error rows in $J_1$. For the $J_2$ row with the two □'s, one scans on $$\binom{3}{1}=3$$

choices of a single visible error row from $J_1$, and compete the X resulting from the intersection of this $J_1$-row with the $J_2$ row and the 2 □'s to a weight-4 shortened-eH codeword (if possible). This results in one additional X on the $J_2$ row. Similarly, for the visible $J_2$ row with a single □, one scans on $$\binom{3}{2}=3$$

choices of two visible error rows from J1, and again complete the 3 resulting coordinates coming from 2 X's mapped from J1 and the single □ to a fourth coordinate from a weight-4 codeword. If the two completions from the two rows are mapped to the same row of J1, then this option is retained. The situation after this stage is depicted in FIG. 11B. The X's marked in J1 with a * are estimations of X's in a hidden row of $J_1$, the X's marked in J2 with a # are estimations of X's in visible error rows of $J_1$.

As explained above, at this stage, the only unknown X's (if any) are those of the $H_{\bar{\ell}}$ hidden error rows of side $J_{\bar{\ell}}$. For example, in FIG. 11B, the only unknown X's are those in the two hidden error rows of J2. Also, the up to 1 hidden error row of side $J_{\bar{\ell}}$ is no longer hidden, as the decoder has a hypothesis for this row. Now there are two different options to proceed: 1) since there are no longer any hidden error rows in $J_\ell$, the remaining pseudo-error can be solved by a simpler method for the case where there are hidden error rows only on one side and 2) the remaining pseudo-error can be solved directly, similarly to the above method.

The $2^{nd}$ Option

If $H_{\bar{\ell}}=0$, then there is nothing to solve, and the entire pattern is already known. If $H_{\bar{\ell}}=1$, then work is performed similarly to the above in order to find the single hidden error row of $J_{\bar{\ell}}$, and consequently all missing X'. In an embodiment, one can find the hidden error row of $J_{\bar{\ell}}$ by completing triples of known coordinates in rows of $J_\ell$ to a weight-4 codewords. These completions need to be mapped to the same row of $J_{\bar{\ell}}$ (verification), which is then the estimated hidden error row.

The case where $H_{\bar{\ell}}=2$, as in FIG. 11B is considered. Let $row_1$, $row_2$ by the indices of the hidden rows in $J_{\bar{\ell}}$. Scan on hypotheses, row, =1, . . . , N, excluding the rows where the decoder acted For each visible error row of $J_\ell$ that does intersects with $row_1$ and has a total of 3 known coordinates coming from: 1. Flippings of the decoder (O's in FIG. 11A), 2. X's that were already found by the algorithm (X's in FIG. 11B marked with # and also X's marked with a * for the no longer hidden error row), 3. The intersection with $row_1$, find a fourth coordinate that completes to a weight-4 codeword If no such codeword exist, discard the choice of $row_1$ and proceed to the next option.

Otherwise, verify that the fourth coordinates coming from all relevant rows of $J_\ell$ are mapped to the same row of $J_{\bar{\ell}}$.

If this is the case, then this row of $J_{\bar{\ell}}$ is an estimation for $row_2$, but a further verification is still required:

Map all X's found in $J_\ell$ that are coming from estimates of $row_1$ and $row_2$ back to $J_{\bar{\ell}}$ By construction, those X's are mapped to $row_1$ and $row_2$. Verify that both of these rows are indeed weight-4 codewords of the shortened-eH code. For example, in FIG. 11B verify that each one of the two X rows (marked with ?) in $J_2$ are indeed codewords of weight 4.

If this is the case, then all the missing X's are known, and hence the entire pseudo-error, and pseudo-error decoding is complete. The decoder can output the pseudo-error.

Otherwise, discard the current choice of $row_1$ and proceed to the next option

If not all fourth coordinates from the relevant rows of $J_\ell$ are mapped to the same row of $J_{\bar{\ell}}$, then discard the choice of $row_1$ and proceed to the next option.

The $1^{st}$ Option

In some cases, it is sufficient to consider only pseudo-errors that are allowed to have hidden error rows only on one side. For example, such cases may arise at an intermediate stage of pseudo-error decoding with hidden rows on both sides, as described in the previous section. As another example, when modifying some decoder parameters, it is possible to assure that practically all pseudo-errors have hidden error rows only on one side, at the cost of slightly decreasing the rBER coverage.

It is assumed that all hidden error rows appear only on one side. In this case, we first scan over two options for the side $J_\ell$, $\ell \in \{0,1\}$, that might contain hidden rows. By assumption, there are no hidden error rows on side $J_{\bar{\ell}}$. This means that the decoder of side $J_{\bar{\ell}}$ acted exactly in the rows that contain the permutation-map of the pseudo-error at the output of $J_\ell$'s decoder. Referring to the $J_{\bar{\ell}}$-rows in which the decoder acted as visible error rows, this suggests the following line of action:

For each row of $J_\ell$, find its intersection with all visible error rows

If for some row there are less than 4 intersections, discard this row

Otherwise, if there are m≥4 intersections, then check for $$\binom{m}{4}$$

choices of 4 indices out of a total of m intersections, and for each such choice check if it is a codeword of the shortened-eH code If not, discard this option. Otherwise, save this option as a potential part of the pseudo-error for the current $J_\ell$ row At this stage, there is typically a small number R of rows of $J_\ell$ for which there is at least one saved codeword. These rows include all visible error rows of $J_\ell$.

We may now run on the hypothesized number r of rows of the pseudo-error on side $J_\ell$, typically in the range r=1, . . . , 6

For each choice of r, we may run on all $$\binom{R}{r}$$

options of choosing r candidate rows of our R rows.

For each choice of r rows, we may now run on all possible choices of a weight-4 codeword from each one of r rows At each scanning instance, we have a hypothesis for the pseudo-error at side $J_\ell$ (accounting only for the visible rows): r weight-4 codewords sitting in r rows.

We may map this pattern to $J_{\bar{\ell}}$ and see that it results exactly in the action of $J_{\bar{\ell}}$'s decoder for the actual pseudo-error. If it does, then the r×4 pattern in $J_\ell$ is a candidate for the pseudo-error.

As an alternative, one can set the output LLRs of all visible error rows of $J_{\bar{\ell}}$ to zero, set the magnitudes of output LLR's of all rows that are not visible error rows in $J_{\bar{\ell}}$ to their maximum possible value, and proceed with eH-GLDPC decoding iterations. Note that when we proceed with the eH-GLDPC decoding iterations, the first step is to map output LLRs from side $J_{\bar{\ell}}$ to side $J_\ell$. In particular, in each row of $J_\ell$, the zero LLRs mark exactly its intersection with the visible error rows of $J_{\bar{\ell}}$, and they are now the lowest LLRs of the row.

Referring back to FIG. 2A or FIG. 2B, in an alternate embodiment, the ECC decoder 228 and logic of the controller 125 for performing the above-described error correction is located in the memory device 126. The memory device 126 may include a logic circuit configured to apply the ECC decoder 228 stored therein to data from a non-volatile memory array within the memory device 126, and to determine whether the ECC decoder 228 is oscillating. As discussed above, the ECC decoder 228 may oscillate between two states while attempting to correct the read data. The logic circuit may determine a total number of rows in first data the decoder attempted to correct, estimate residual error rows among the total number that no longer have an error after the attempt, determine second visible error rows in second data of the decoder that continue to have an error by permuting indices of the residual error rows according to a permutation, determine whether zero or more first hidden error rows are present in the first data from the second visible error rows, and correct the first data using the first visible error rows and the determined number of first hidden error rows when it is determined that the decoder 228 is oscillating between the two states. The logic circuit may output the error corrected data to the controller 125. The controller 125 may provide an instruction to the logic circuit to read the data in response to receiving a read request from a host. The logic circuit may perform the above-described decoding and error correction after reading the data in response to receiving the instruction.

The above-described methods may be tangibly embodied on one or more computer readable medium(s) (i.e., program storage devices such as a hard disk, magnetic floppy disk, RAM, ROM, CD ROM, Flash Memory, etc., and executable by any device or machine comprising suitable architecture, such as a general purpose digital computer having a processor, memory, and input/output interfaces).

Figure 12:
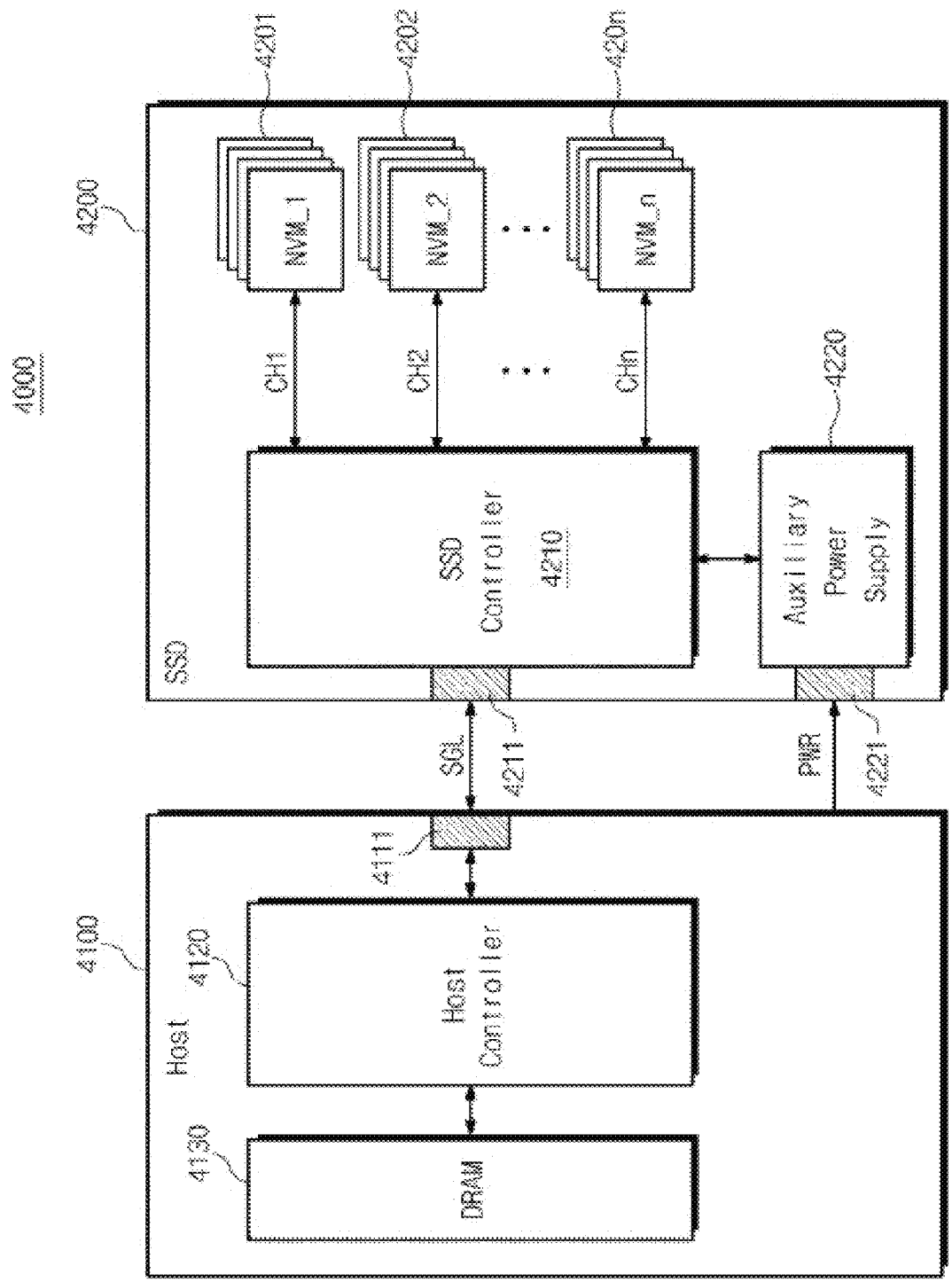
FIG. 12 is a block diagram illustrating a solid state drive system according to an exemplary embodiment of the inventive concept.

FIG. 12 is a block is a block diagram illustrating a solid state drive system according to an exemplary embodiment of the inventive concept. Referring to FIG. 12, a solid state drive (SSD) system 4000 includes a host 4100 and an SSD 4200. The host 4100 includes a host interface 4111, a host controller 4120, and a DRAM 4130.

The host 4100 may write data in the SSD 4200 or read data from the SSD 4200. The host controller 4120 may transfer signals SGL such as a command, an address, a control signal, and the like to the SSD 4200 via the host interface 4111. The DRAM 4130 may be a main memory of the host 4100.

The SSD 4200 may exchange signals SGL with the host 4100 via the host interface 4211, and may be supplied with a power via a power connector 4221. The SSD 4200 may include a plurality of nonvolatile memories 4201 through 420*n*, an SSD controller 4210, and an auxiliary power supply 4220. Herein, the nonvolatile memories 4201 to 420*n* may be implemented by NAND flash memory. The SSD controller 4210 may be implemented by the controller 125 of FIG. 1, FIG. 2A, or FIG. 2B. Each of the memory devices 4201 through 420*n* may be implemented by the memory device 126 of FIG. 1, FIG. 2A, or FIG. 2B.

The plurality of nonvolatile memories 4201 through 420*n* may be used as a storage medium of the SSD 4200. The plurality of nonvolatile memories 4201 to 420*n* may be connected with the DDS controller 4210 via a plurality of channels CH1 to CHn. One channel may be connected with one or more nonvolatile memories. Each of the channels CH1 to CHn may correspond to the data channel 130 depicted in FIG. 1. Nonvolatile memories connected with one channel may be connected with the same data bus.

The SSD controller 4210 may exchange signals SGL with the host 4100 via the host interface 4211. Herein, the signals SGL may include a command (e.g., the CMD), an address (e.g., the ADDR), data, and the like. The SSD controller 4210 may be configured to write or read out data to or from a corresponding nonvolatile memory according to a command of the host 4100.

The auxiliary power supply 4220 may be connected with the host 4100 via the power connector 4221. The auxiliary power supply 4220 may be charged by a power PWR from the host 4100. The auxiliary power supply 4220 may be placed within the SSD 4200 or outside the SSD 4200. For example, the auxiliary power supply 4220 may be put on a main board to supply an auxiliary power to the SSD 4200.

While an embodiment with respect to FIGS. 6-11*b* has been described above with an initial step that starts with $J_1$ and then later includes steps with respect to $J_2$, the inventive concept is not limited thereto. For example, the initial step applied to $J_1$ may instead be applied to $J_2$ and then the later steps with respect to $J_2$ would be replaced with corresponding steps with respect to $J_1$.

Figure 13:
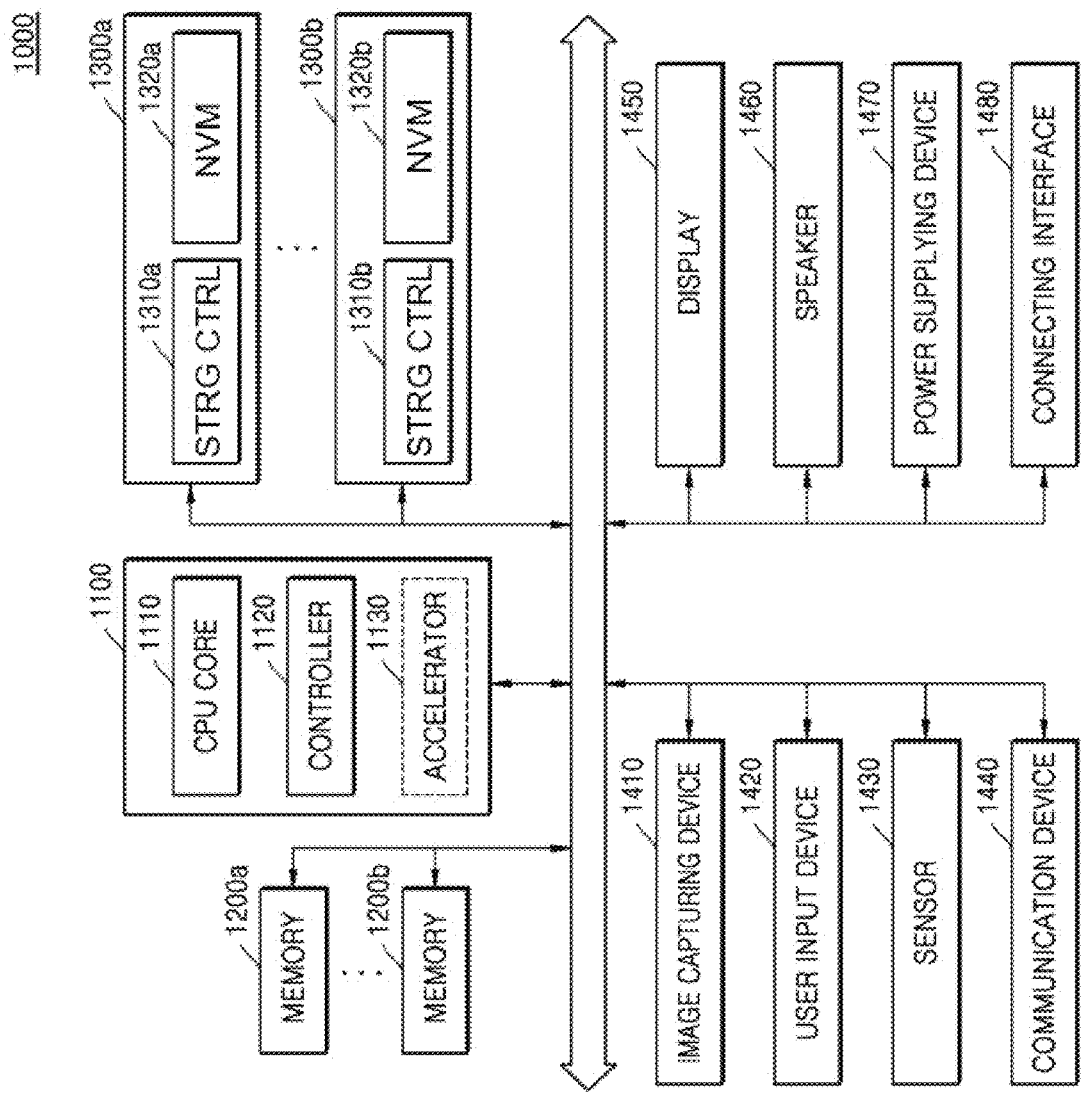
FIG. 13 is a block diagram of a system to which is a storage device is applied according to an exemplary embodiment of the inventive concept.

FIG. 13 is a diagram of a system 1000 to which a storage device is applied, according to an embodiment. The system 1000 of FIG. 1 may basically be a mobile system, such as a portable communication terminal (e.g., a mobile phone), a smartphone, a tablet personal computer (PC), a wearable device, a healthcare device, or an Internet of things (IOT) device. However, the system 1000 of FIG. 13 is not necessarily limited to the mobile system and may be a PC, a laptop computer, a server, a media player, or an automotive device (e.g., a navigation device).

Referring to FIG. 13, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100. The accelerator 1130 may include the ECC encoder 222 and the ECC decoder 228 similar to the accelerator 128 illustrated in FIG. 2B.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers(STRG CTRL) 1310a and 1310b and NVM (Non-Volatile Memory)s 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 100 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 14:
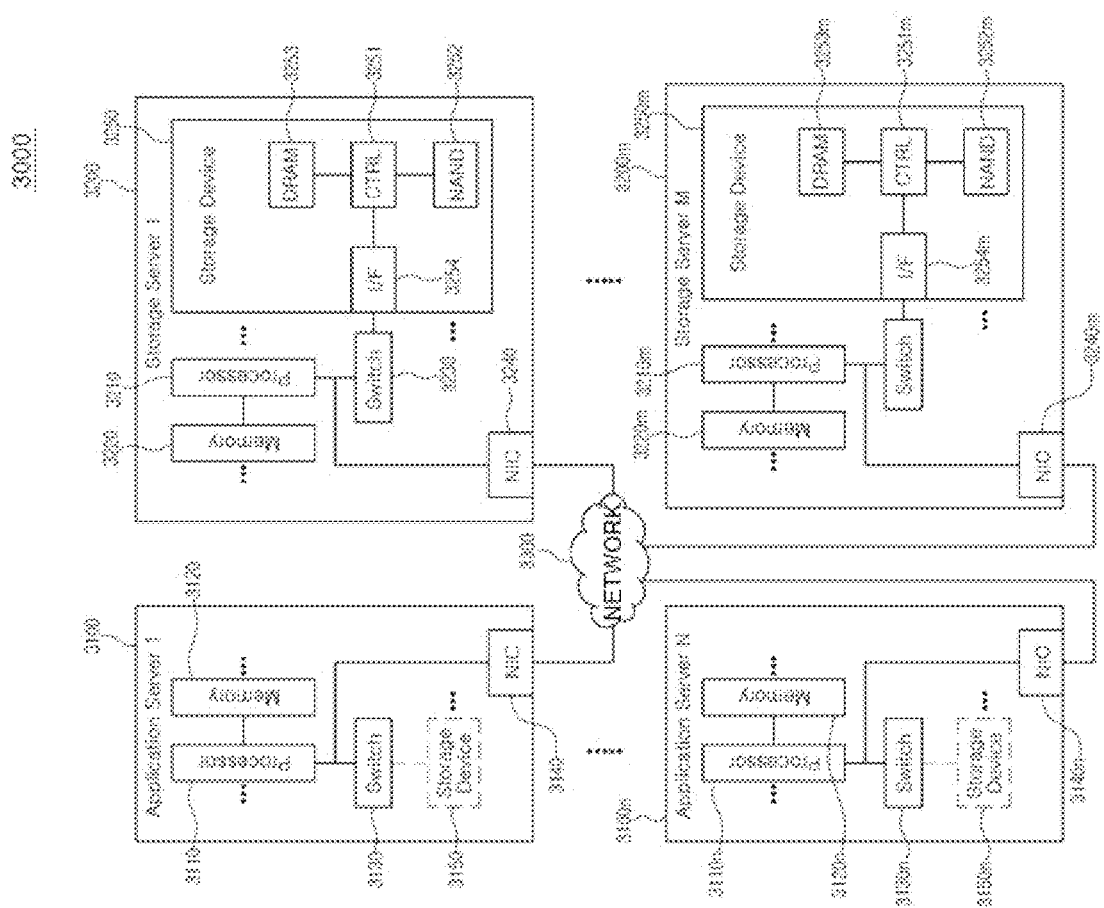
FIG. 14 is a block diagram of a data center to which a memory device is applied, according to an exemplary embodiment of the inventive concept.

FIG. 14 is a diagram of a data center 3000 to which a memory device is applied, according to an embodiment.

Referring to FIG. 14, the data center 3000 may be a facility that collects various types of pieces of data and provides services and be referred to as a data storage center. The data center 3000 may be a system for operating a search engine and a database, and may be a computing system used by companies, such as banks, or government agencies. The data center 3000 may include application servers 3100 to 3100n and storage servers 3200 to 3200m. The number of application servers 3100 to 3100n and the number of storage servers 3200 to 3200m may be variously selected according to embodiments. The number of application servers 3100 to 3100n may be different from the number of storage servers 3200 to 3200m. Each of the storage servers 3200 to 3200m may include the accelerator 128 discussed above with respect to FIG. 2B.

The application servers 3100 to 3100n may communicate with the storage servers 3200 to 3200m through a network 3300. The network 3300 may be implemented by using a fiber channel (FC) or Ethernet. In this case, the FC may be a medium used for relatively high-speed data transmission and use an optical switch with high performance and high availability. The storage servers 3200 to 3200m may be provided as file storages, block storages, or object storages according to an access method of the network 3300.

In an embodiment, the network 3300 may be a storage-dedicated network, such as a storage area network (SAN). For example, the SAN may be an FC-SAN, which uses an FC network and is implemented according to an FC protocol (FCP). As another example, the SAN may be an Internet protocol (IP)-SAN, which uses a transmission control protocol (TCP)/IP network and is implemented according to a SCSI over TCP/IP or Internet SCSI (iSCSI) protocol. In another embodiment, the network 3300 may be a general network, such as a TCP/IP network. For example, the network 3300 may be implemented according to a protocol, such as FC over Ethernet (FCoE), network attached storage (NAS), and NVMe over Fabrics (NVMe-oF).

Hereinafter, the application server 3100 and the storage server 3200 will mainly be described. A description of the application server 3100 may be applied to another application server 3100n, and a description of the storage server 3200 may be applied to another storage server 3200m.

The application server 3100 may store data, which is requested by a user or a client to be stored, in one of the storage servers 3200 to 3200m through the network 3300. Also, the application server 3100 may obtain data, which is requested by the user or the client to be read, from one of the storage servers 3200 to 3200m through the network 3300. For example, the application server 3100 may be implemented as a web server or a database management system (DBMS).

The application server 3100 may access a memory 3120n or a storage device 3150n, which is included in another application server 3100n, through the network 3300. Alternatively, the application server 3100 may access memories 3220 to 3220m or storage devices 3250 to 3250m, which are included in the storage servers 3200 to 3200m, through the network 3300. Thus, the application server 3100 may perform various operations on data stored in application servers 3100 to 3100n and/or the storage servers 3200 to 3200m. For example, the application server 3100 may execute an instruction for moving or copying data between the application servers 3100 to 3100n and/or the storage servers 3200 to 3200m. In this case, the data may be moved from the storage devices 3250 to 3250m of the storage servers 3200 to 3200m to the memories 3120 to 3120n of the application servers 3100 to 3100n directly or through the memories 3220 to 3220m of the storage servers 3200 to 3200m. The data moved through the network 3300 may be data encrypted for security or privacy.

The storage server 3200 will now be described as an example. An interface 3254 may provide physical connection between a processor 3210 and a controller 3251 and a physical connection between a network interface card (NIC) 3240 and the controller 3251. For example, the interface 3254 may be implemented using a direct attached storage (DAS) scheme in which the storage device 3250 is directly connected with a dedicated cable. For example, the interface 3254 may be implemented by using various interface schemes, such as ATA, SATA, e-SATA, an SCSI, SAS, PCI, PCIe, NVMe, IEEE 1394, a USB interface, an SD card interface, an MMC interface, an eMMC interface, a UFS interface, an eUFS interface, and/or a CF card interface.

The storage server 3200 may further include a switch 3230 and the NIC(Network InterConnect) 3240. The switch 3230 may selectively connect the processor 3210 to the storage device 3250 or selectively connect the NIC 3240 to the storage device 3250 via the control of the processor 3210.

In an embodiment, the NIC 3240 may include a network interface card and a network adaptor. The NIC 3240 may be connected to the network 3300 by a wired interface, a wireless interface, a Bluetooth interface, or an optical interface. The NIC 3240 may include an internal memory, a digital signal processor (DSP), and a host bus interface and be connected to the processor 3210 and/or the switch 3230 through the host bus interface. The host bus interface may be implemented as one of the above-described examples of the interface 3254. In an embodiment, the NIC 3240 may be integrated with at least one of the processor 3210, the switch 3230, and the storage device 3250.

In the storage servers 3200 to 3200m or the application servers 3100 to 3100n, a processor may transmit a command to storage devices 3150 to 3150n and 3250 to 3250m or the memories 3120 to 3120n and 3220 to 3220m and program or read data. In this case, the data may be data of which an error is corrected by an ECC engine. The data may be data on which a data bus inversion (DBI) operation or a data masking (DM) operation is performed, and may include cyclic redundancy code (CRC) information. The data may be data encrypted for security or privacy.

Storage devices 3150 to 3150n and 3250 to 3250m may transmit a control signal and a command/address signal to NAND flash memory devices 3252 to 3252m in response to a read command received from the processor. Thus, when data is read from the NAND flash memory devices 3252 to 3252m, a read enable (RE) signal may be input as a data output control signal, and thus, the data may be output to a DQ bus. A data strobe signal DQS may be generated using the RE signal. The command and the address signal may be latched in a page buffer depending on a rising edge or falling edge of a write enable (WE) signal.

The controller 3251 may control all operations of the storage device 3250. In an embodiment, the controller 3251 may include SRAM. In an embodiment, the controller 3251 may include the ECC encoder 222 and the ECC decoder 228 of FIG. 2A. In another embodiment, the controller 3251 may be connected to the accelerator 128 like that shown in FIG. 2B. The controller 3251 may write data to the NAND flash memory device 3252 in response to a write command or read data from the NAND flash memory device 3252 in response to a read command. For example, the write command and/or the read command may be provided from the processor 3210 of the storage server 3200, the processor 3210m of another storage server 3200m, or the processors 3110 and 3110n of the application servers 3100 and 3100n. DRAM 3253 may temporarily store (or buffer) data to be written to the NAND flash memory device 3252 or data read from the NAND flash memory device 3252. Also, the DRAM 3253 may store metadata. Here, the metadata may be user data or data generated by the controller 3251 to manage the NAND flash memory device 3252. The storage device 3250 may include a secure element (SE) for security or privacy.

Although the present inventive concept has been described in connection with exemplary embodiments thereof, those skilled in the art will appreciate that various modifications can be made to these embodiments without substantially departing from the principles of the present inventive concept.

What is claimed is:

1. A method of processing a request by a host to access data stored in a memory device, the method comprising:
    reading data from the memory device in response to the request;
    applying an iterative decoder to the read data;
    upon determining that the iterative decoder is oscillating,
        determining a total number of rows in first data the decoder attempted to correct;
        estimating first visible error rows among the total number that continue to have an error after the attempt;
        estimating residual error rows among the total number that no longer have an error after the attempt;
        determining second visible error rows in second data of the decoder that continue to have an error by permuting indices of the residual error rows according to a permutation;

determining whether zero or more first hidden error rows are present in the first data from the second visible error rows, where each hidden error row has an error and is a valid Hamming codeword;

correcting the first data using the first visible error rows and the determined number of first hidden error rows; and outputting the corrected data to the host.

2. The method of claim 1, further comprising providing an output of the iterative decoder to the host when it is determined that the iterative decoder is not oscillating and all constraints of the iterative decoder are satisfied.

3. The method of claim 1, wherein the iterative decoder is determined to be oscillating when the decoder attempts to correct a first number of errors in the read data to generate the first data, and the decoder attempts to correct a second number of errors in the second data to restore the first data including the first number of errors.

4. The method of claim 1, wherein correcting the first data using the first visible error rows and the determined number of first hidden error rows comprises:

setting log-likelihood ratios (LLRs) of rows of the first data determined to be the first visible error rows to 0;

setting LLRs of rows of the first data determined to be a hidden error row to 0;

increasing a magnitude of LLRs of the remaining rows of the first data to a value having a higher magnitude; and applying the first data and the LLRs to the iterative decoder.

5. The method of claim 1, where determining whether zero or more first hidden error rows are present in the first data from the second visible error rows comprises:

completing each of the second visible error rows to a weight-3 vector using the first visible error rows;

applying a Hamming decoder to flip first bits of the weight-3 vectors to generate weight-4 vectors;

mapping the first bits to second bits in the first data using an inverse of the permutation to generate predictions of row indexes of the at least one hidden error row; and determining a location of the zero or more first hidden error rows from the predictions that agree with one another.

6. The method of claim 1, the correcting comprising:

determining a number of second hidden error rows in the second data based on a total number of the first hidden error rows, a total number of the first visible error rows, a total number of corrections attempted on the first visible error rows by the decoder, and a total number of corrections attempted on the second visible error rows by the decoder.

7. The method of claim 6, the correcting further comprising:

choosing one of the rows of the second data to represent a first one of the second hidden error rows;

selecting the first visible error rows in the first data that have 3 known coordinates;

using a Hamming decoder on the 3 known coordinates to deduce a $4^{th}$ coordinate for each of the selected first visible error rows; and correcting the first data using the deduced coordinates.

8. The method of claim 7, the correcting further comprising flipping bits of the first data having the 3 known coordinates.

9. The method of claim 8, wherein the coordinates are used in the correcting only if the $4^{th}$ coordinates map to a same row in the second data.

10. The method of claim 1, wherein the iterative decoder is configured to decode a generalized low-density parity-check (GLDPC) code based on a Hamming code.

11. The method of claim 10, wherein the Hamming code is a shortened extended Hamming code.

12. A memory system comprising:

a nonvolatile memory (NVM); and a controller configured to read data from the NVM, wherein the controller comprises an iterative decoder, wherein the controller is configured to apply the iterative decoder to the read data and determine whether the iterative decoder is oscillating, and wherein the controller is configured to determine a total number of rows in first data the decoder attempted to correct to generate second data, estimate residual error rows among the total number that no longer have an error after the attempt, determine second visible error rows in the second data that continue to have an error by permuting indices of the residual error rows according to a permutation, determine whether zero or more first hidden error rows are present in the first data from the second visible error rows, and correct the first data using the first visible error rows and the determined number of first hidden error rows when it is determined that the iterative decoder is oscillating, wherein each hidden error row has an error and is a valid Hamming codeword.

13. The memory system of claim 12, wherein the controller reads the data and outputs the corrected data to the host in response to a request from a host.

14. The memory system of claim 12, wherein the iterative decoder is determined to be oscillating when the decoder attempts to correct a first number of errors in the read data to generate the first data, the decoder permutes the first data to generate the second data, and the decoder attempts to correct a second number of errors in the second data to restore the first data including the first number of errors.

15. The memory system of claim 12, wherein the correction of the first data is performed by setting log-likelihood ratios (LLRs) of rows of the first data determined to be the first visible error rows to 0, setting LLRs of rows of the first data determined to be a hidden error row to 0, increasing a magnitude of LLRs of the remaining rows of the first data to a value having a higher magnitude, and applying the first data and the LLRs to the iterative decoder.

16. The memory system of claim 12, wherein the iterative decoder is configured to decode a generalized low-density parity-check (GLDPC) code based on a Hamming code.

17. The memory system of claim 16, wherein the Hamming code is a shortened extended Hamming code.

18. A nonvolatile memory (NVM) device comprising:

a nonvolatile memory (NVM) array;

an iterative decoder; and a logic circuit configured to apply the iterative decoder to decode data read from the NVM array, and wherein the logic circuit is configured to determine a total number of rows in first data the decoder attempted to correct to generate second data, estimate residual error rows among the total number that no longer have an error after the attempt, determine second visible error rows in the second data that continue to have an error by permuting indices of the residual error rows according to a permutation, and correct the first data using the first visible error rows when the iterative decoder is repeatedly changing between two states during the decode.

19. The NVM device of claim 18, wherein the iterative decoder is repeatedly changing between two states when the decoder attempts to correct a first number of errors in the read data to generate the first data, permutes the first data to generate the second data, and attempts to correct a second number of errors in the second data to restore the first data including the first number of errors.

20. The NVM device of claim 18, wherein the correction of the first data is performed by setting log-likelihood ratios (LLRs) of rows of the first data determined to be the first visible error rows to 0, increasing a magnitude of LLRs of the remaining rows of the first data to a value having a higher magnitude, and applying the first data and the LLRs to the iterative decoder.

* * * * *